United States Patent
Sutardja

(10) Patent No.: US 7,881,126 B2
(45) Date of Patent: Feb. 1, 2011

(54) MEMORY STRUCTURE WITH WORD LINE BUFFERS

(75) Inventor: Pantas Sutardja, Los Gatos, CA (US)

(73) Assignee: Marvell World Trade Ltd., St. Michael (BB)

( * ) Notice: Subject to any disclaimer, the term of this patent is extended or adjusted under 35 U.S.C. 154(b) by 317 days.

(21) Appl. No.: 12/128,122

(22) Filed: May 28, 2008

(65) Prior Publication Data

US 2008/0298140 A1 Dec. 4, 2008

Related U.S. Application Data

(60) Provisional application No. 60/941,138, filed on May 31, 2007.

(51) Int. Cl.
*G11C 7/00* (2006.01)
*G11C 8/00* (2006.01)
(52) U.S. Cl. .................. 365/189.05; 365/189.11; 365/230.06; 365/148; 365/163
(58) Field of Classification Search ............ 365/189.11, 365/230.06, 148, 163, 189.05
See application file for complete search history.

(56) References Cited

U.S. PATENT DOCUMENTS

| | | | |
|---|---|---|---|
| 4,583,202 A | 4/1986 | Konishi | |
| 4,719,603 A | 1/1988 | Shinagawa | |
| 6,295,219 B1 | 9/2001 | Honigschmid | |
| 6,545,923 B2 * | 4/2003 | Sim et al. | 365/230.06 |
| 6,580,658 B1 * | 6/2003 | Hsu et al. | 365/230.06 |
| 6,930,923 B2 * | 8/2005 | Chen et al. | 365/189.11 |
| 6,982,912 B2 * | 1/2006 | Yamagami | 365/230.06 |
| 7,092,277 B2 * | 8/2006 | Bedeschi et al. | 365/148 |
| 7,269,091 B2 * | 9/2007 | Ueda | 365/230.06 |
| 7,366,051 B2 * | 4/2008 | Ueda | 365/230.06 |
| 7,515,475 B1 * | 4/2009 | Reddy | 365/189.11 |
| 7,570,525 B2 * | 8/2009 | Nii et al. | 365/189.11 |
| 7,602,654 B2 * | 10/2009 | Yabuuchi et al. | 365/189.11 |

FOREIGN PATENT DOCUMENTS

| | | |
|---|---|---|
| WO | EP 0 019 241 | 11/1980 |
| WO | EP 0 478 252 | 4/1992 |
| WO | EP 0 903 747 | 3/1999 |

OTHER PUBLICATIONS

Notification of Transmittal of the International Search Report and The Written Opinion of the International Searching Authority, or the Declaration dated Nov. 6, 2008 in reference to PCT/US2008/065050.

* cited by examiner

*Primary Examiner*—Trong Phan

(57) ABSTRACT

A memory comprises a plurality of memory cells. A row decoder module selectively drives word lines using a voltage level to access selected ones of the memory cells. A first regeneration module selectively pulls the voltage level on one of the word lines to one of first and second predetermined voltage levels. At least one of the memory cells of the one of the word lines is located between the first regeneration module and the row decoder module.

45 Claims, 15 Drawing Sheets

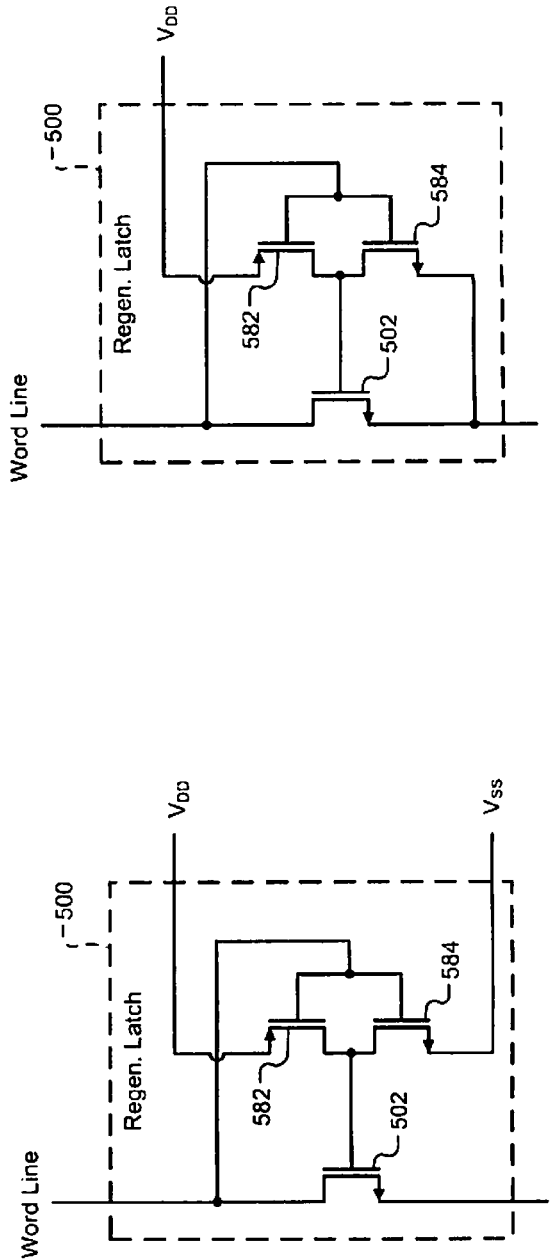

MEMORY STRUCTURE WITH WORD LINE BUFFERS

CROSS-REFERENCE TO RELATED APPLICATIONS

This application claims the benefit of U.S. Provisional Application No. 60/941,138, filed on May 31, 2007. The disclosure of the above application is incorporated herein by reference in its entirety.

FIELD

The present disclosure relates to memories and more particularly to memories with word line buffers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional schematic of a memory structure is presented. A row decoder 102 activates one or more word lines 104. Values are read from or written to memory cells 106 of the selected word line 104 via bit lines 108. The memory cells 106 each include a transistor 110 and a capacitor 112. For example only, the transistor 110 may be a metal-oxide-semiconductor field-effect transistor (MOSFET) having a gate, a source, and a drain.

For example only, the transistor 110 may be an n-channel MOSFET. The drain of the transistor 110 is connected to the respective bit line 108 and the gate of the transistor 110 is connected to the respective word line 104. The source of the transistor 110 is connected to a first terminal of the capacitor 112. A second terminal of the capacitor 112 is connected to a ground potential.

SUMMARY

A memory comprises a plurality of memory cells. A row decoder module selectively drives word lines using a voltage level to access selected ones of the memory cells. A first regeneration module selectively pulls the voltage level on one of the word lines to one of first and second predetermined voltage levels. At least one of the memory cells of the one of the word lines is located between the first regeneration module and the row decoder module.

In other features, the first predetermined voltage level is greater than the second predetermined voltage level. The first regeneration module selectively pulls the voltage level to the first predetermined voltage level when the voltage level is greater than a predetermined threshold. The first regeneration module selectively pulls the voltage level to the second predetermined voltage level when the voltage level is less than the predetermined threshold. The first regeneration module suspends pulling the voltage level to the first predetermined voltage level when the voltage level is less than the predetermined threshold. The first predetermined voltage level is greater than the second predetermined voltage level. The first regeneration module selectively pulls the voltage level to the second predetermined voltage level when the voltage level is less than a predetermined threshold.

In other features, the first regeneration module suspends pulling the voltage level to the second predetermined voltage level when the voltage level is greater than the predetermined threshold. The one of the word lines extends between the row decoder module and a distal cell of the memory cells. The first regeneration module is located adjacent to the distal cell. A second regeneration module for the one of the word lines is located between the distal cell and the row decoder module.

In other features, the one of the word lines extends between the row decoder module and a distal cell of the memory cells. The first regeneration module is located halfway between the distal cell and the row decoder module. The word lines comprise N word lines, wherein N is an integer greater than 1, and N regeneration modules including the first regeneration module. Each of the N regeneration modules corresponds to a respective one of the N word lines.

In other features, the memory cells selectively draw a DC current. The memory cells include bipolar junction transistors. The memory cells include phase-change memory devices. The first regeneration module receives a control signal having an active state and an inactive state and disables pulling the voltage level when the control signal is in the inactive state.

In other features, a regeneration control module generates the control signal having the inactive state for a predetermined period of time after the row decoder drives the voltage level onto the word lines. A regeneration control module generates the control signal having the inactive state for a first predetermined period of time after the row decoder drives the voltage level onto the word lines and for a second predetermined period of time before the row decoder drives the voltage level onto the word lines.

In other features, the first regeneration module includes first and second inverters each having an input and an output. The output of the first inverter communicates with the input of the second inverter. The output of the second inverter and the input of the first inverter communicate with the one of the word lines. The second inverter is selectively placed in a high-impedance state by a control signal. The first and second inverters are both selectively placed in a high-impedance state by a control signal. The first regeneration module includes an inverter having an input and an output and a transistor having a control terminal and first and second terminals.

A method for operating memory comprises providing a plurality of memory cells; using a row decoder to selectively drive word lines using a voltage level to access selected ones of the memory cells; providing a first regeneration module that selectively pulls the voltage level on one of the word lines to one of first and second predetermined voltage levels; and locating at least one of the memory cells of the one of the word lines between the first regeneration module and the row decoder module.

In other features, the first predetermined voltage level is greater than the second predetermined voltage level and further comprising selectively pulling the voltage level to the first predetermined voltage level when the voltage level is greater than a predetermined threshold. The method includes selectively pulling the voltage level to the second predetermined voltage level when the voltage level is less than the predetermined threshold. The method includes suspending pulling the voltage level to the first predetermined voltage level when the voltage level is less than the predetermined threshold. The first predetermined voltage level is greater than the second predetermined voltage level and further comprising selectively pulling the voltage level to the second predetermined voltage level when the voltage level is less than a predetermined threshold.

In other features, the method includes suspending pulling the voltage level to the second predetermined voltage level when the voltage level is greater than the predetermined threshold. The one of the word lines extends between the row decoder module and a distal cell of the memory cells. The first regeneration module is located adjacent to the distal cell. The method includes providing a second regeneration module for the one of the word lines that is located between the distal cell and the row decoder module.

In other features, the method includes extending the one of the word lines between the row decoder module and a distal cell of the memory cells; and locating the first regeneration module is located halfway between the distal cell and the row decoder module. The word lines comprise N word lines, wherein N is an integer greater than 1. The method further comprises providing N regeneration modules including the first regeneration module. Each of the N regeneration modules corresponds to a respective one of the N word lines.

In other features, the memory cells selectively draw a DC current. The memory cells include bipolar junction transistors. The memory cells include phase-change memory devices. The method includes receiving a control signal having an active state and an inactive state; and disabling pulling the voltage level when the control signal is in the inactive state. The method includes generating the control signal having the inactive state for a predetermined period of time after the row decoder drives the voltage level onto the word lines. The method includes generating the control signal having the inactive state for a first predetermined period of time after the row decoder drives the voltage level onto the word lines and for a second predetermined period of time before the row decoder drives the voltage level onto the word lines.

A memory comprises a plurality of memory cells. Row decoder means selectively drives word lines using a voltage level to access selected ones of the memory cells. First regeneration means selectively pulls the voltage level on one of the word lines to one of first and second predetermined voltage levels. At least one of the memory cells of the one of the word lines is located between the first regeneration means and the row decoder means.

In other features, the first predetermined voltage level is greater than the second predetermined voltage level. The first regeneration means selectively pulls the voltage level to the first predetermined voltage level when the voltage level is greater than a predetermined threshold. The first regeneration means selectively pulls the voltage level to the second predetermined voltage level when the voltage level is less than the predetermined threshold. The first regeneration means suspends pulling the voltage level to the first predetermined voltage level when the voltage level is less than the predetermined threshold. The first predetermined voltage level is greater than the second predetermined voltage level. The first regeneration means selectively pulls the voltage level to the second predetermined voltage level when the voltage level is less than a predetermined threshold.

In other features, the first regeneration means suspends pulling the voltage level to the second predetermined voltage level when the voltage level is greater than the predetermined threshold. The one of the word lines extends between the row decoder means and a distal cell of the memory cells. The first regeneration means is located adjacent to the distal cell. Second regeneration means for the one of the word lines is located between the distal cell and the row decoder means.

In other features, the one of the word lines extends between the row decoder means and a distal cell of the memory cells. The first regeneration means is located halfway between the distal cell and the row decoder means. The word lines comprise N word lines, wherein N is an integer greater than 1, and N regeneration means including the first regeneration means. Each of the N regeneration means corresponds to a respective one of the N word lines.

In other features, the memory cells selectively draw a DC current. The memory cells include bipolar junction transistors. The memory cells include phase-change memory devices. The first regeneration means receives a control signal having an active state and an inactive state and disables pulling the voltage level when the control signal is in the inactive state.

In other features, regeneration control means generates the control signal having the inactive state for a predetermined period of time after the row decoder drives the voltage level onto the word lines. Regeneration control means generates the control signal having the inactive state for a first predetermined period of time after the row decoder drives the voltage level onto the word lines and for a second predetermined period of time before the row decoder drives the voltage level onto the word lines.

In other features, the first regeneration means includes first and second inverters each having an input and an output, wherein the output of the first inverter communicates with the input of the second inverter. The output of the second inverter and the input of the first inverter communicate with the one of the word lines. The second inverter is selectively placed in a high-impedance state by a control signal. The first and second inverters are both selectively placed in a high-impedance state by a control signal. The first regeneration means includes an inverter having an input and an output and a transistor having a control terminal and first and second terminals.

A memory comprises a plurality of word lines each including a plurality of memory cells. A row decoder module supplies a voltage level to a driven one of the plurality of word lines to access selected ones of the memory cells associated with the driven one of the plurality of word lines. A plurality of regeneration modules are configured to selectively pull the voltage level to one of a first predetermined voltage level and a second predetermined voltage level. One or more of the plurality of regeneration modules are disposed along each of the plurality of word lines and are arranged between two of the plurality of memory cells in each of the plurality of word lines.

In other features, the first predetermined voltage level is greater than the second predetermined voltage level. Each of the plurality of regeneration modules is further configured to selectively pull the voltage level to the first predetermined voltage level when the voltage level is greater than a predetermined threshold. One of the plurality of regeneration modules is further configured to selectively pull the voltage level to the second predetermined voltage level when the voltage level is less than the predetermined threshold. A plurality of control modules are configured to control a group of the plurality of regeneration modules associated with the plurality of word lines, and wherein the group of regeneration modules includes at least one of the plurality of regeneration modules from each of the plurality of word lines. Each of the plurality of regeneration modules is further configured to begin selectively pulling the voltage level to one of the first voltage level and second voltage level after a predetermined period.

In other features, the predetermined period starts after the voltage level is applied by the row decoder module. The plurality of memory cells selectively draw DC current. The plurality of memory cells include bipolar junction transistors. The plurality of memory cells further include phase-change memory devices.

At least one of the plurality of regeneration modules includes first and second inverters each having an input and an output. The output of the first inverter communicates with the input of the second inverter. The output of the second inverter and the input of the first inverter communicate with one of the plurality of word lines. The second inverter is selectively placed in a high-impedance state by a control signal. The first and second inverters are both selectively placed in a high-impedance state by a control signal. At least one of the plurality of regeneration modules includes an inverter having an input and an output and a transistor having a control terminal and first and second terminals. The output of the inverter communicates with the control terminal of the transistor, the first terminal of the transistor and the input of the inverter communicate with one of the plurality of word lines, and the second terminal of the transistor receives a control signal.

A memory comprises a plurality of memory cells, a row decoder module, and a first regeneration module. The row decoder module selectively drives word lines using first and second predetermined voltage levels to access selected ones of the memory cells. The first regeneration module selectively pulls a voltage at a first location of one of the word lines toward one of the first and second predetermined voltage levels. At least one of the memory cells corresponding to the one of the word lines is located between the first location and the row decoder module.

In other features, the first regeneration module selectively pulls the voltage at the first location to one of third and fourth predetermined voltage levels. The third predetermined voltage level is approximately equal to the first predetermined voltage level and the fourth predetermined voltage level is approximately equal to the second predetermined voltage level. The first predetermined voltage level is greater than the second predetermined voltage level. The first regeneration module selectively pulls the voltage at the first location toward the first predetermined voltage level when the voltage at the first location is greater than a predetermined threshold.

In further features, the first regeneration module selectively pulls the voltage at the first location toward the second predetermined voltage level when the voltage at the first location is less than the predetermined threshold. The first regeneration module suspends pulling the voltage at the first location toward the first predetermined voltage level when the voltage at the first location is less than the predetermined threshold. The first predetermined voltage level is greater than the second predetermined voltage level. The first regeneration module selectively pulls the voltage at the first location toward the second predetermined voltage level when the voltage at the first location is less than a predetermined threshold.

In still other features, the first regeneration module suspends pulling the voltage at the first location toward the second predetermined voltage level when the voltage at the first location is greater than the predetermined threshold. The one of the word lines extends between the row decoder module and a distal cell of the memory cells. The first location is adjacent to the distal cell. Further comprises a second regeneration module for the one of the word lines that selectively pulls a voltage at a second location of the one of the word lines toward the one of the first and second predetermined voltage levels. The second location is between the first location and the row decoder module.

In other features, the word lines comprise N word lines, wherein N is an integer greater than 1, and further comprises N regeneration modules including the first regeneration module, Each of the N regeneration modules corresponds to a respective one of the N word lines. The memory cells selectively draw a DC current. The memory cells include bipolar junction transistors. The memory cells include phase-change memory devices. The first regeneration module receives a control signal having an active state and an inactive state and disables pulling the voltage at the first location when the control signal is in the inactive state.

In further features, the memory further comprises a regeneration control module that generates the control signal having the inactive state for a predetermined period of time after the row decoder drives the word lines. The memory further comprises a regeneration control module that generates the control signal having the inactive state for a first predetermined period of time after the row decoder drives the word lines and for a second predetermined period of time before the row decoder drives the word lines.

In still other features, the first regeneration module includes first and second inverters each having an input and an output. The output of the first inverter communicates with the input of the second inverter. The output of the second inverter and the input of the first inverter communicate with the first location. The second inverter is selectively placed in a high-impedance state by a control signal. The first and second inverters are both selectively placed in a high-impedance state by a control signal. The first regeneration module includes an inverter having an input and an output and a transistor having a control terminal and first and second terminals.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 6-7C are functional schematic diagrams of exemplary regeneration latches according to the principles of the present disclosure;

DETAILED DESCRIPTION

Figure 1:
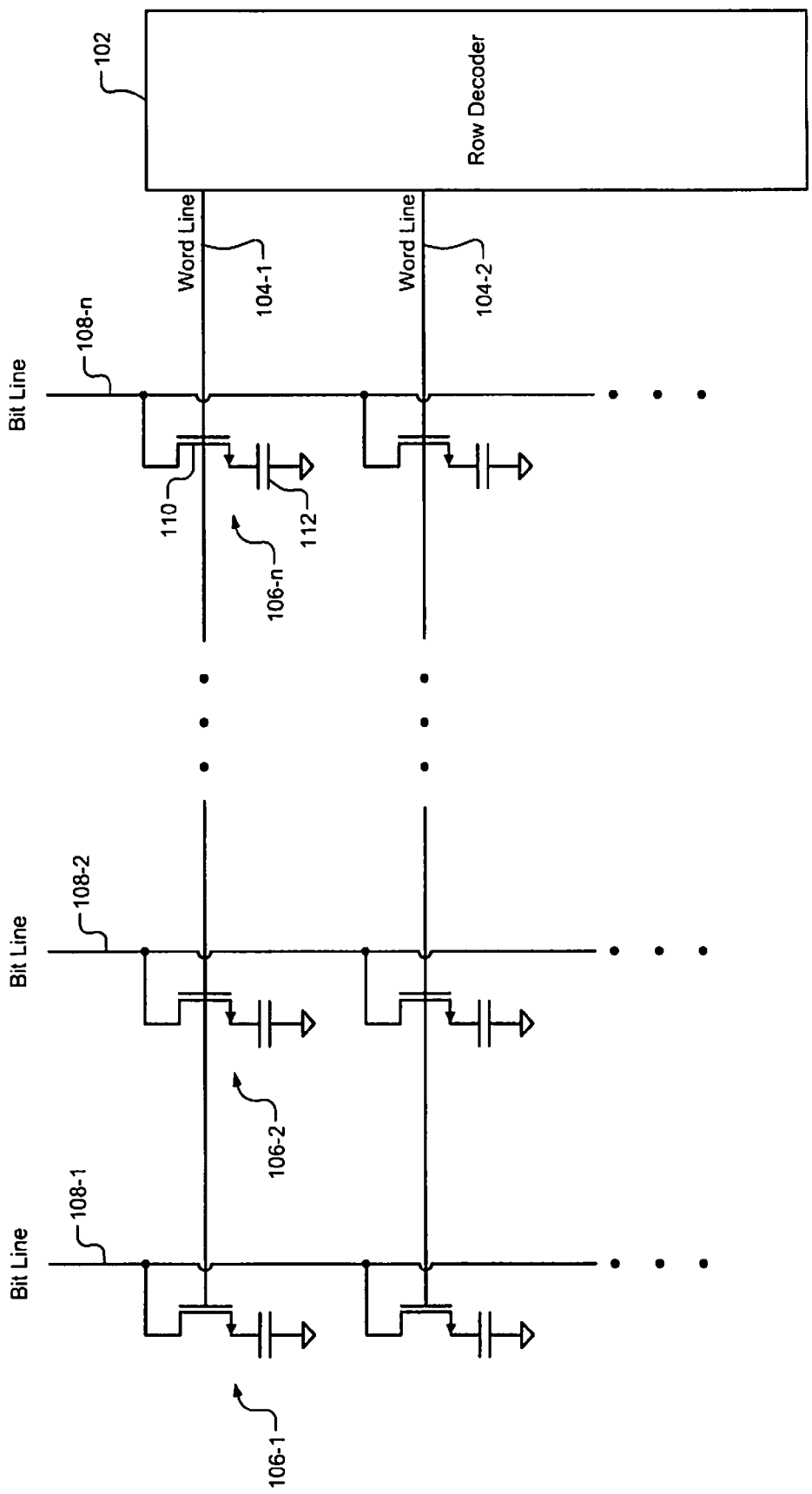
FIG. 1 is a functional schematic of a memory structure according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Memory arrays include multiple rows (or word lines) and multiple columns (or bit lines). For example only, a memory array may include 16 word lines and 8,192 bit lines. Memory cells are located at the cross points between bit lines and word lines. Word lines are generally connected to control terminals of the memory cells.

Figure 2:
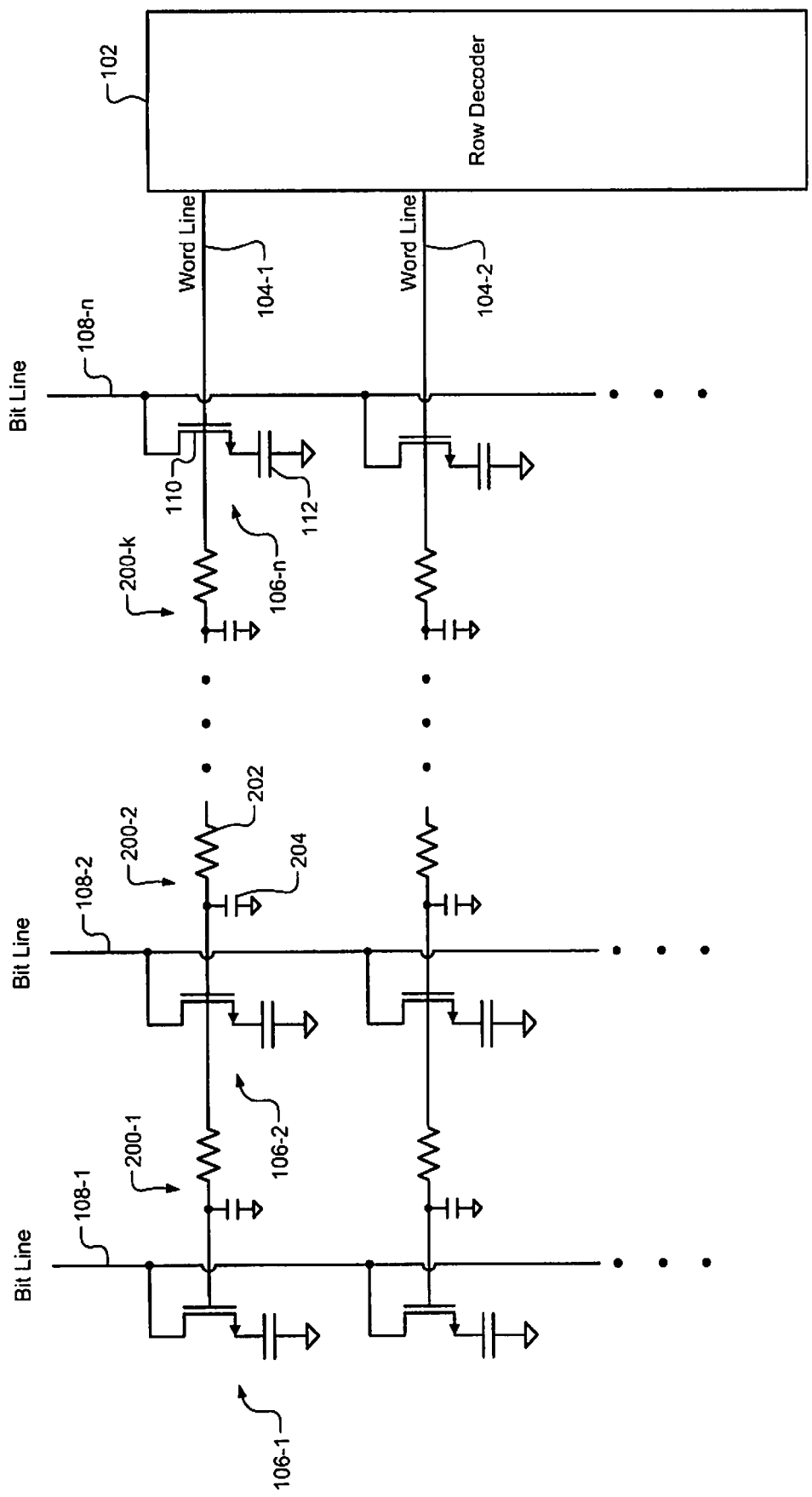
FIG. 2 is a functional schematic of an exemplary memory array showing word line parasitics according to the principles of the present disclosure.

Word lines have a non-zero resistance and also have distributed parasitic capacitance. In driving gates of MOSFETs, as shown in FIG. 2, the parasitic resistance and capacitance slow the propagation of new values on the word line from a row decoder to the memory cells farthest from the row decoder. Because MOSFETs typically draw almost zero DC gate current, a negligible voltage is dropped across the parasitic resistances once the parasitic capacitances have charged. In other words, all the memory cells along a word line eventually reach approximately the same voltage.

Figure 3:
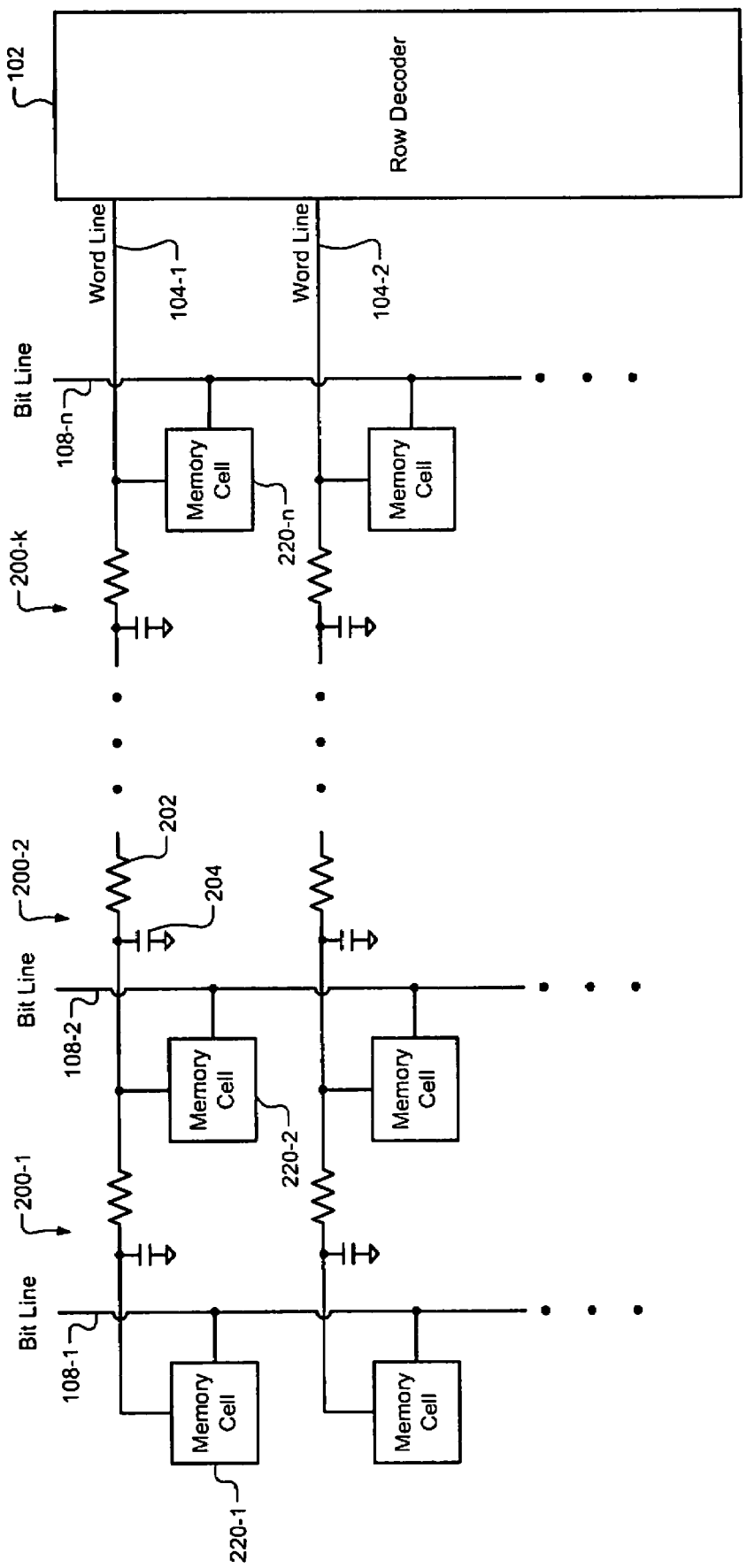
FIG. 3 is a functional schematic diagram of another exemplary memory array showing word line parasitics according to the principles of the present disclosure.

Other memory cells, such as those shown in FIG. 3, may use switching elements that have a non-zero control current. For example, memory cells may include bipolar junction transistors (BJTs), which have a non-zero base current. BJTs may be chosen despite their non-zero base current because of their high current drive capability. The non-zero control currents create a voltage drop across the parasitic resistance of the word lines. Voltages at the control terminals of the memory cells farther from the row decoder will therefore be incrementally higher or lower than the voltages close to the row decoder.

Figure 4:
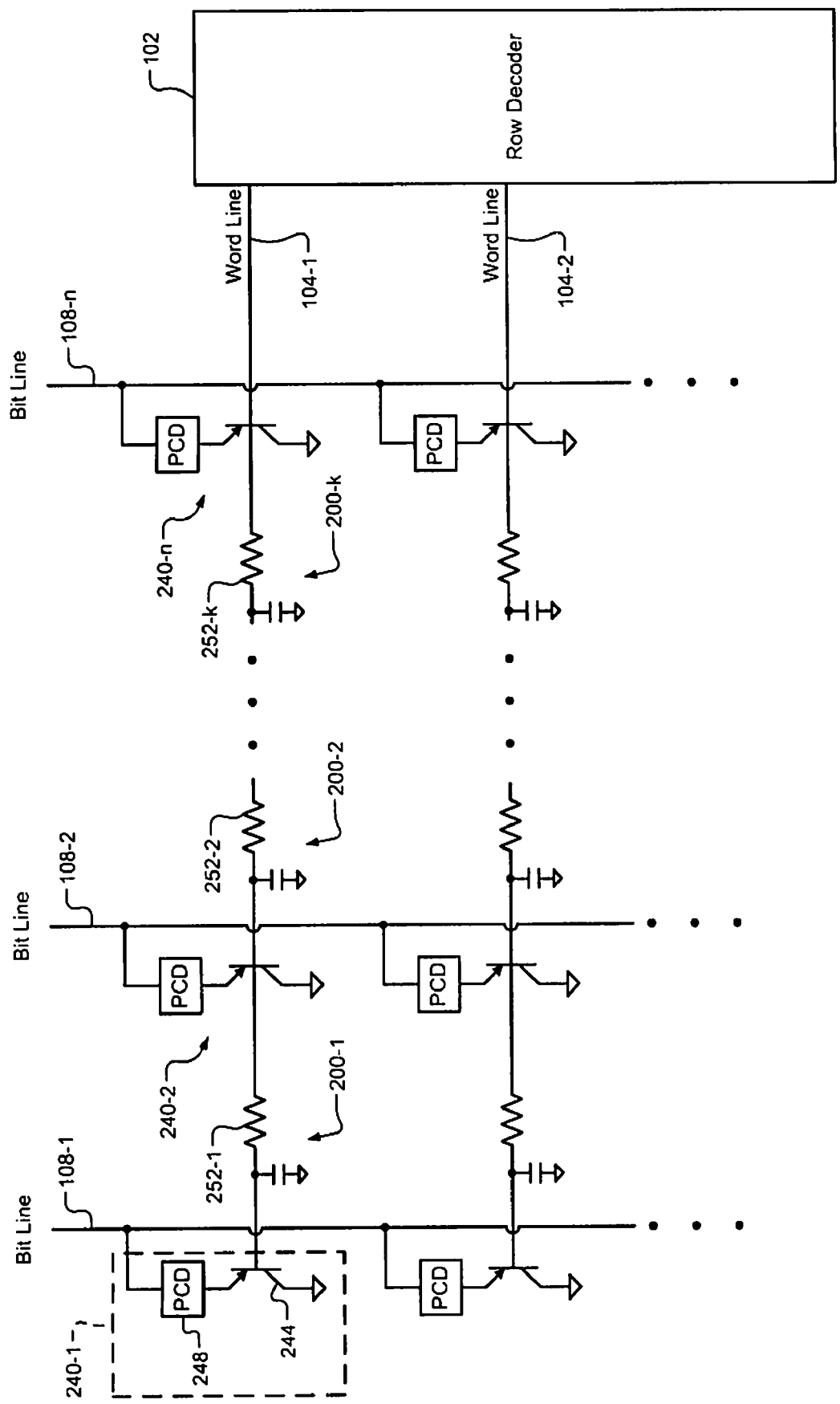
FIG. 4 is a functional schematic of an exemplary phase change memory including control devices that draw a DC current according to the principles of the present disclosure.
Figure 5:
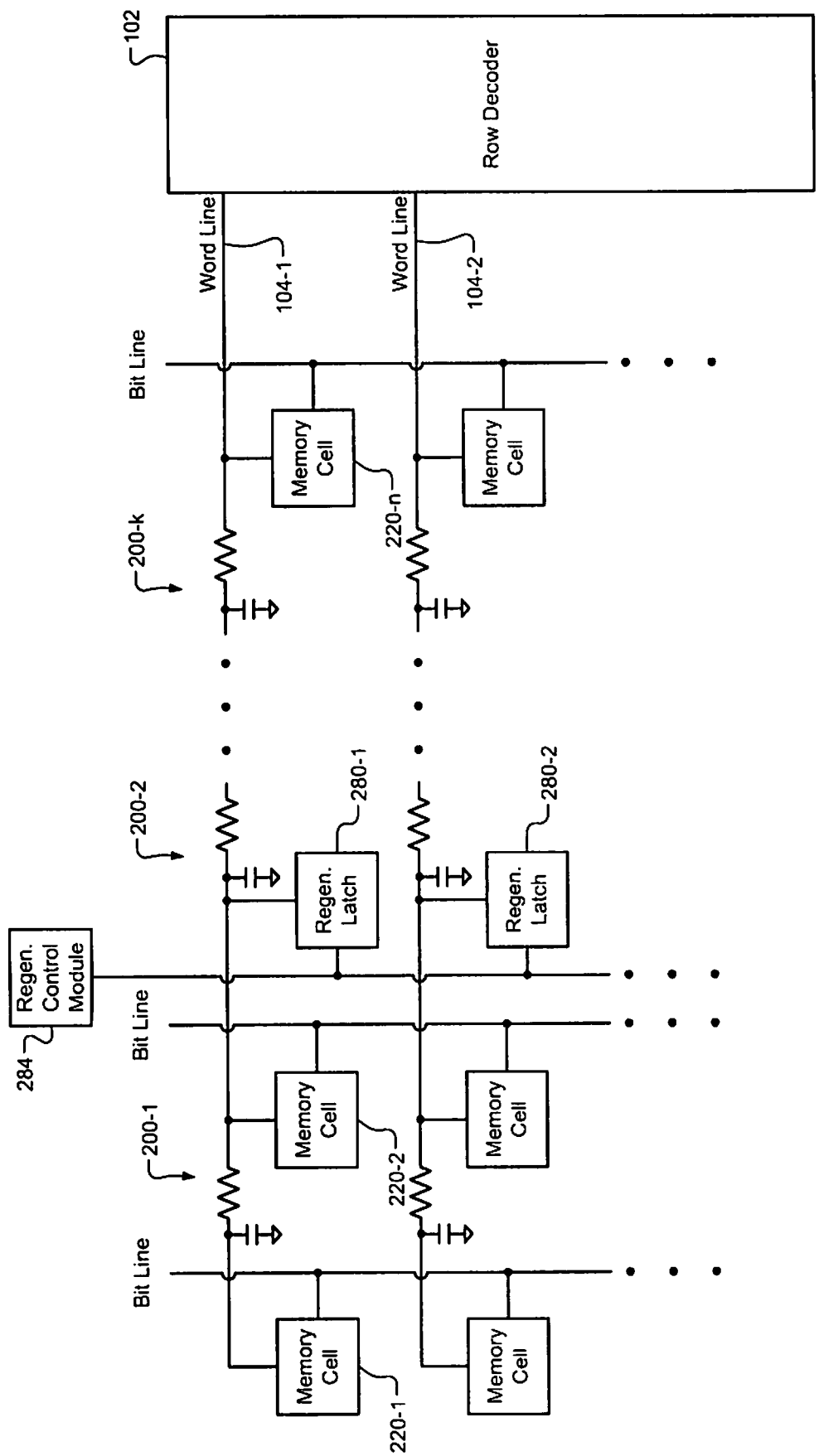
FIG. 5 is a functional schematic of an exemplary memory array including regeneration latches according to the principles of the present disclosure.

FIG. 4 depicts an exemplary phase change memory array that uses BJTs. The non-zero base current of the BJTs causes each word line's voltage to vary along its length. FIG. 5 shows a memory including regeneration latches that can pull the word line to a desired voltage at a point away from the row decoder. The desired voltage may be approximately equal to the voltage being driven by the row decoder. The desired voltage may be generated from the same power supplies as the voltage driven by the row decoder. For example only, there may be less than a 5% difference between the desired voltage and the voltage driven by the row decoder.

Figure 6B:
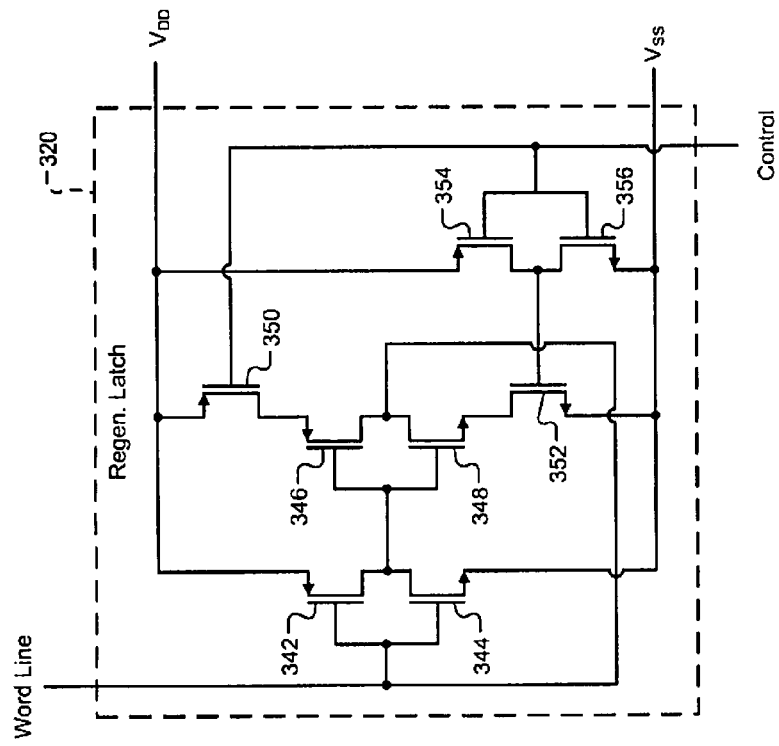
Figure 6:
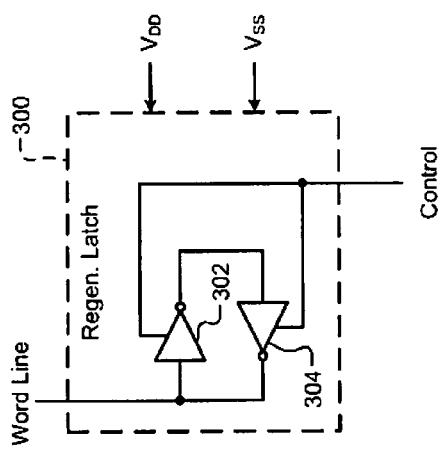
Figure 8:
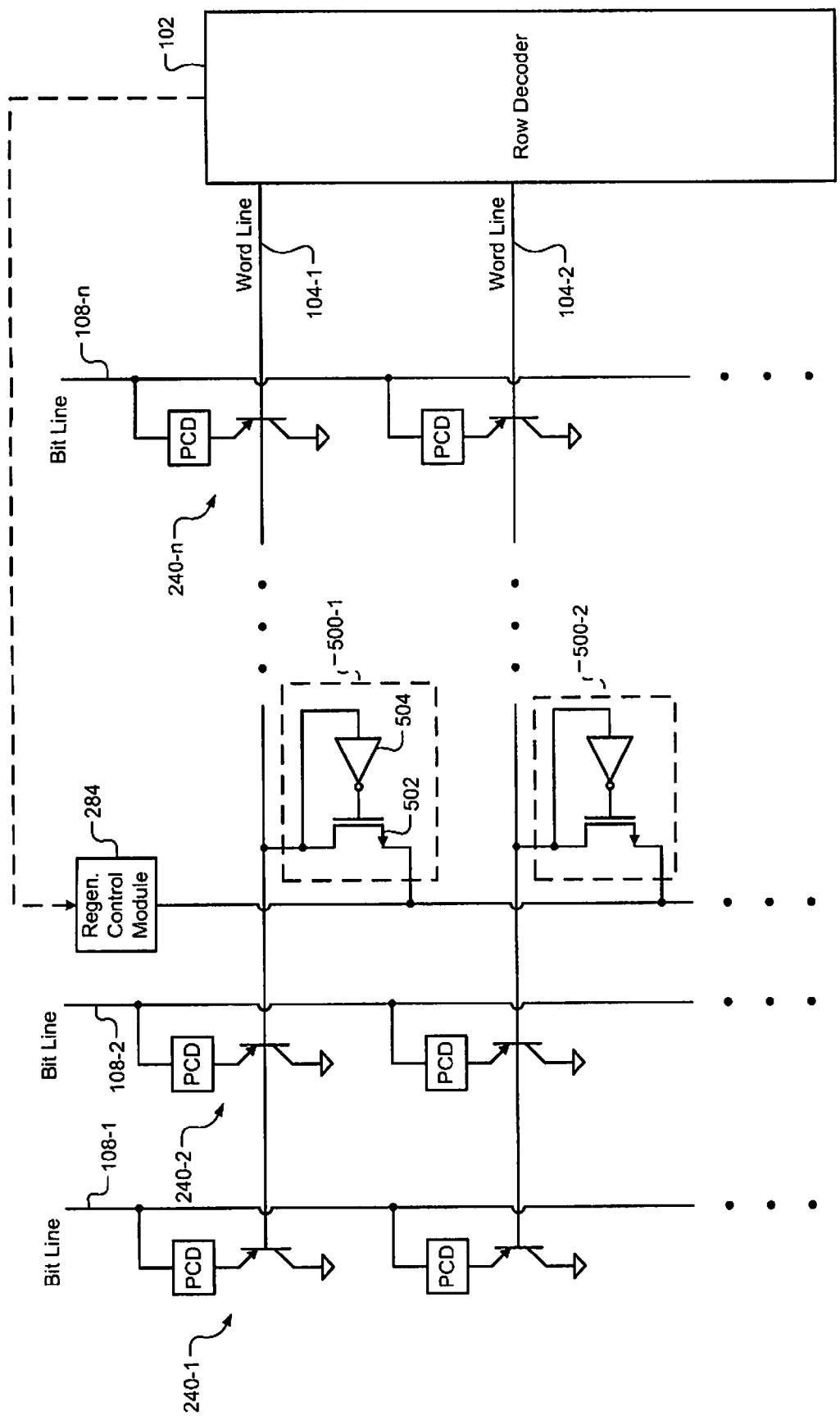
FIG. 8 is a functional schematic diagram of an exemplary phase change memory array incorporating one of the exemplary regeneration latches according to the principles of the present disclosure.
Figure 9:
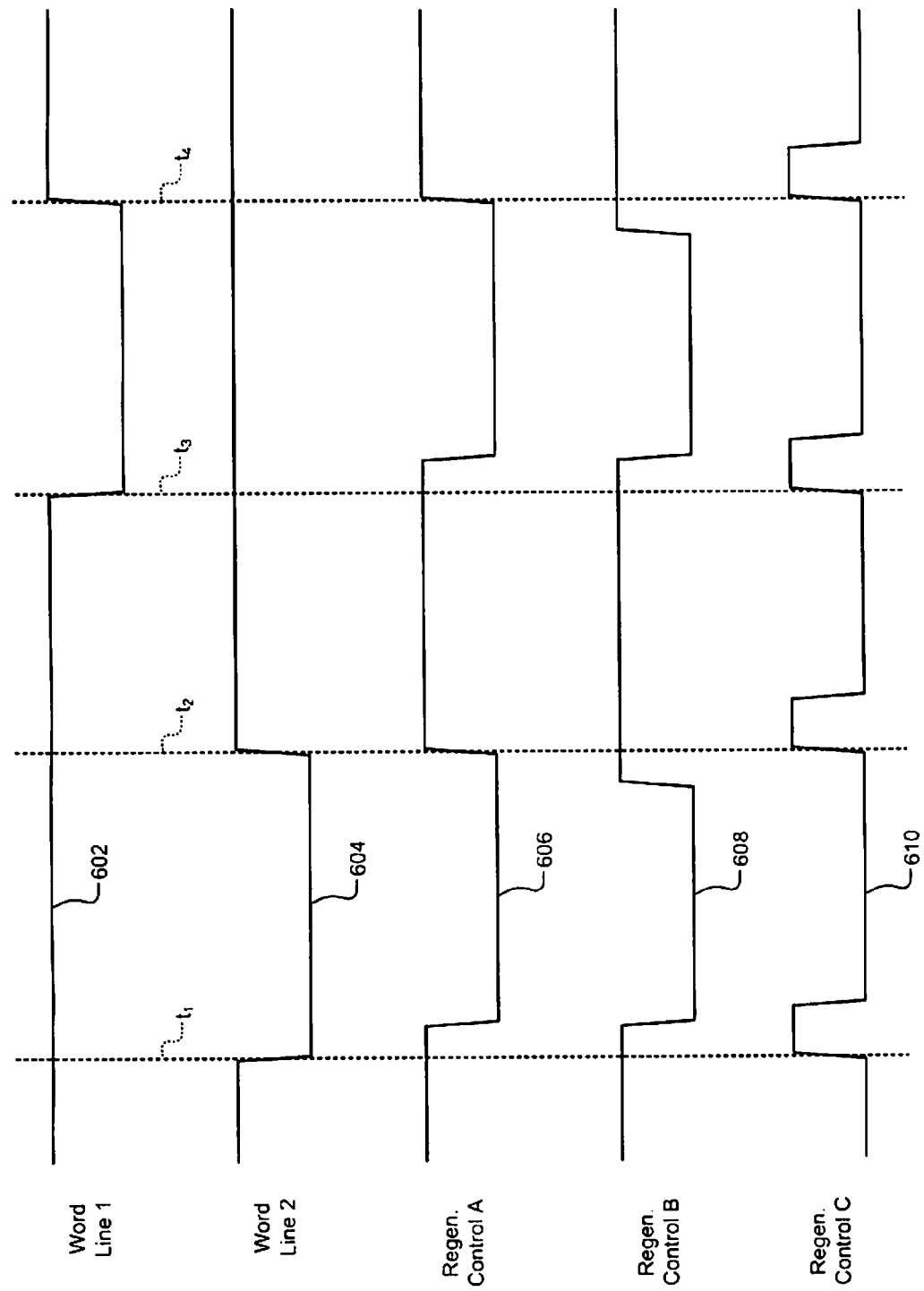
FIG. 9 is a set of graphical traces of exemplary control signals for sample word line data according to the principles of the present disclosure.

Multiple regeneration latches can be distributed along the word line to more uniformly pull the word line to the desired voltage. FIGS. 6-7C depict various implementations of the regeneration latch, while FIG. 8 shows an exemplary phase change memory array incorporating one of the exemplary regeneration latches. FIG. 9 depicts various exemplary control timings used in controlling the regeneration latches.

Referring back to FIG. 2, a functional schematic of an exemplary memory array depicts word line parasitics. The word lines 104 connected to the row decoder 102 may have nonzero resistance and parasitic capacitance. Parasitic resistance and capacitance can be modeled as distributed resistors and capacitors. For example, in FIG. 2, the parasitic resistance and capacitance of the word line 104 is shown as distributed parasitic elements 200 along the word lines 104. Each parasitic element 200 includes a series resistance 202 and a parallel capacitance 204.

The parasitic element 200 acts as a low-pass filter and limits the rate of change of the word line voltage for the memory cells 106 that are farthest from the row decoder 102. The farther the memory cell 106 is from the row decoder 102, the greater the effect of the low-pass filter. Eventually, however, all of the memory cells 106 receive approximately the same control voltage via the word line 104. This is because there is negligible DC current flowing through the parasitic resistances 202 and therefore only a negligible voltage drop.

Referring now to FIG. 3, a functional schematic diagram of an exemplary memory array having generic memory cells 220 and depicting parasitics is presented. The memory cells 220 are located at intersections of the bit lines 108 and the word lines 104. The memory cells 220 may include an element connected to the word line 104 that draws DC current. In such a case, a voltage drop is created across the resistances 202.

The memory cells 220 farthest from the row decoder 102 therefore receive a smaller signal than the memory cells 220 closest to the row decoder 102. For example only, the element drawing DC current may include a BJT, which has a non-zero base current, and/or a short-channel MOSFET that has a non-negligible gate leakage current.

The memory cells 220 may draw DC current intermittently, such as during one or two of programming, erasing, and/or reading. For example only, the memory cells 220 may draw current only when programming or erasing. In other implementations, the memory cells 220 may draw DC current when programming, erasing, and reading.

The voltage at the farthest memory cell 220 may be higher or lower than the voltage at the closest memory cell 220 based upon the direction of current flow. Because there may be many bit lines 108, the voltage drop across the resistances 202 may be especially significant for the memory cells 220 farthest away from the row decoder 102. For example only, there may be 4,096 bit lines, meaning that there are 4,096 memory cells 220 for each word line 104. The voltage drop may lead to farther ones of the memory cells 220 being insufficiently programmed or erased, and may produce weaker read signals from the distant memory cells 220.

Referring now to FIG. 4, a functional schematic of an exemplary phase change memory including memory cells 240 that draw a DC current is depicted. The memory cells 240 are located at the intersections of the bit lines 108 and the word lines 104. Each memory cell 240 includes a bipolar junction transistor (BJT) 244 and a phase change device (PCD) 248. The BJT 244 includes a base, an emitter, and a collector, and may be a pnp-type BJT.

For example, the PCD 248 may comprise one or more phase-change memory cells including phase change material such as chalcogenide alloy and/or other suitable material having a property that can be programmed. For example only, a resistance of the phase change material may be adjusted to one of N values by heating and/or cooling the phase change material using different heating and/or cooling intervals, where N is an integer greater than one. When N=2, the phase change memory cells store a single bit binary value. As N increases, each memory cell may store more than one bit. As a result of the heating and/or cooling, the phase change material may be set to one of N points in the range from amorphous and crystalline. As can be appreciated, the N points will have different resistance values. The different resistance values can be used to store data.

The memory cells 240 may alternately include other types of storage devices, other types of transistors that draw DC current at their control terminals, and/or other elements that draw DC current. The base of the BJT 244 is connected to the word line 104. The emitter of the BJT 244 is connected to the PCD 248, which is then connected to the bit line 108. The collector of the BJT 244 is connected to a reference potential, such as ground.

To turn on the BJT 244, the row decoder 102 pulls the word line 104 low. The low voltage on the word line 104 creates an emitter-base voltage $V_{EB}$ that turns on the BJT 244. The base current of the BJT 244 of memory cell 240-1, which is farthest from the row decoder 102, flows through the first modeled parasitic resistance 252-1. The word line voltage at the memory cell 240-1 is therefore greater than the voltage at memory cell 240-2 by an amount approximately equal to the base current times the first resistance 252-1.

The base currents of both the first and second memory cells 240-1 and 240-2 flow through the second resistance 252-2, creating double the voltage drop. This effect continues for the remaining memory cells 240 along the same word line 104 until the last modeled parasitic resistance 252-$k$ is reached. All of the base currents except the base current from the last memory cell 240-$n$ flow through the last resistance 252-$n$.

The base voltage for the BJT 244 of the first memory cell 240-1 is therefore higher than for the BJT 244 of the nth memory cell 240-$n$ by the sum of all the voltage drops created by each of the n−1 memory cells 240. The sum is equal to a sum over all the n−1 memory cells 240 of the selected memory cell's base current times the total resistance between the selected memory cell and the final memory cell 240-$n$.

Referring now to FIG. 5, a functional schematic of an exemplary memory array including regeneration latches is depicted. Each word line 104 includes one or more regeneration latches 280. Once new values from the row decoder 102 propagate down the word lines 104, the regeneration latches 280 sense the voltage of the respective word line 104 and pull it fully to the desired value.

For example, if the row decoder 102 drives one of the word lines 104 low, the regeneration latch 280 can sense that the word line 104 is near a low voltage and pull the word line 104 all the way to the desired low voltage. The regeneration latch 280 may be controlled by a regeneration control module 284. As described in more detail below with respect to FIG. 9, the regeneration control module 284 may enable the regeneration latches 280 at a specific time. This specific time may be a predetermined period after the row decoder 102 has driven the word lines 104 to a new value.

The regeneration control module 284 may disable the regeneration latches 280 prior to the row decoder 102 driving the word lines 104 to a new value. Otherwise, the regeneration latches 280 may prevent the word lines 104 from reaching new values. The regeneration latch 280 may be located at the end of the word line 104 farthest from the row decoder 102, may be located in the middle of the word line 104, or may be located at any other suitable point.

In various implementations, multiple regeneration latches 280 may be implemented for each word line 104. The number of regeneration latches 280 may be determined by the number of memory cells 220 and the amount of current drawn by the memory cells 220. When using more regeneration latches 280, the word line drivers of the row decoder 102 may require less power and may be implemented in a smaller area.

Figure 6A:
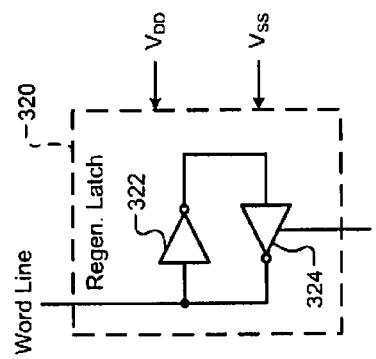
Figure 6D:
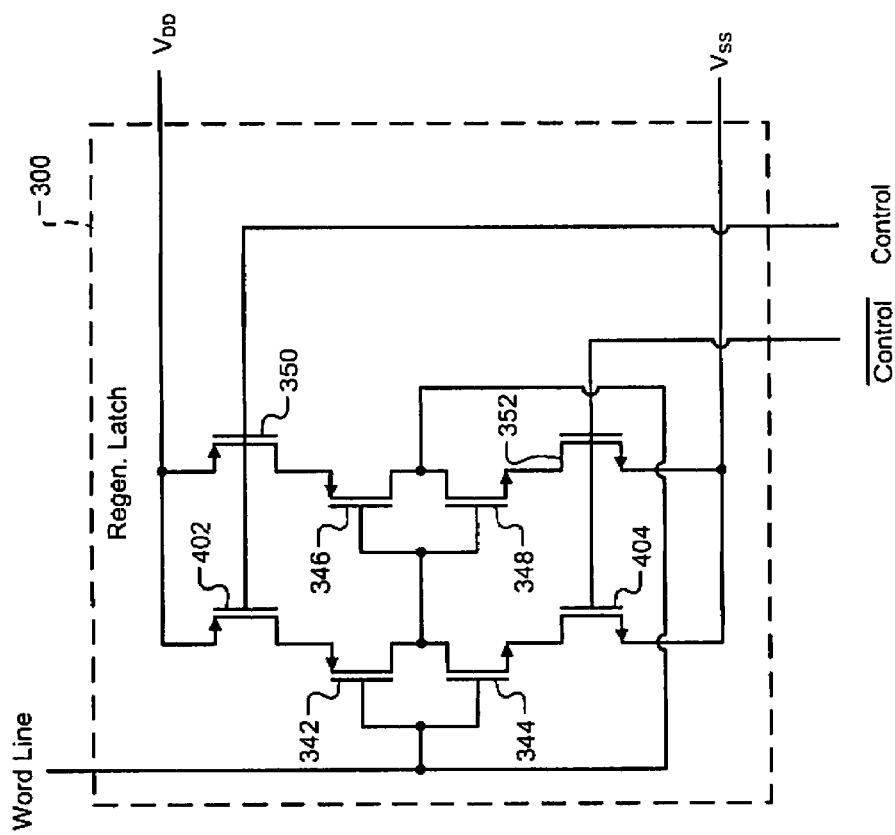
Figure 6C:
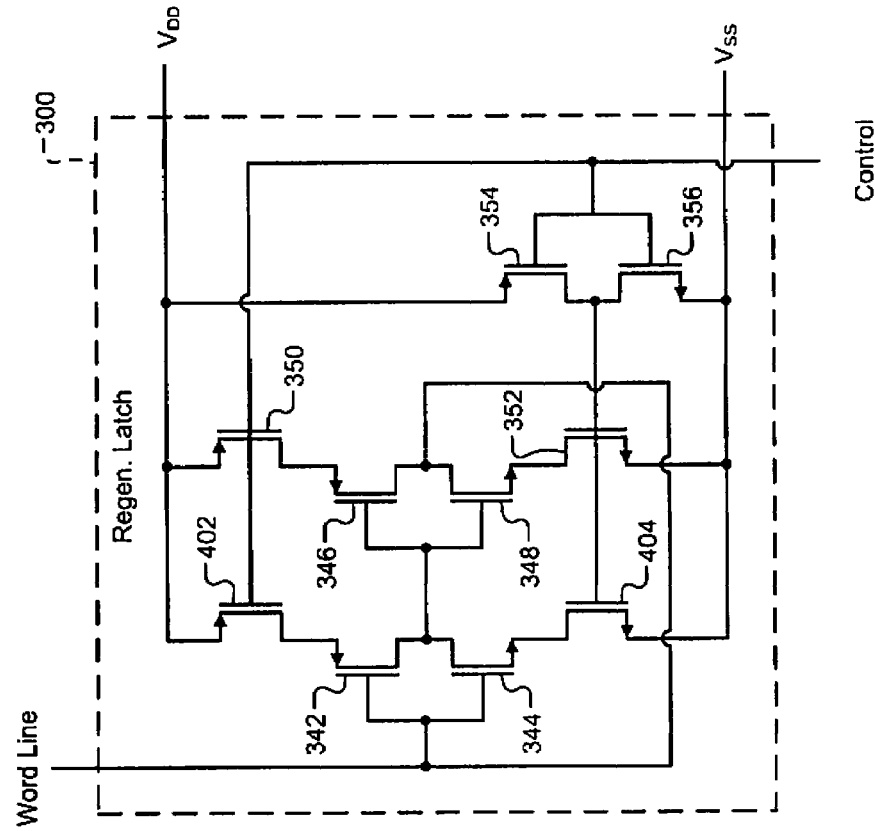

FIGS. 6-6D depict exemplary regeneration latches based on a two-inverter ring. FIG. 6B depicts an exemplary circuit implementation of FIG. 6A, while FIGS. 6C and 6D depict exemplary circuit representations of FIG. 6. FIGS. 7 and 7A depict exemplary regeneration latches capable of pulling the word line in one direction. FIGS. 7B-7C depict exemplary circuit implementations of FIG. 7.

Referring now to FIG. 6, a functional schematic diagram of an exemplary regeneration latch 300 is presented. The regeneration latch 300 includes first and second inverters 302 and 304, each having an input, an output, and a control terminal. The first and second inverters 302 and 304 are powered by supply potentials, such as $V_{DD}$ and $V_{SS}$.

The output of the first inverter 302 is connected to the input of the second inverter 304, and the output of the second inverter 304 is connected to the input of the first inverter 302. The input of the first inverter 302 is connected to the word line. The control terminals of the first and second inverters 302 and 304 are connected to a control signal, such as that received from the regeneration control module 284 of FIG. 5.

The first and second inverters 302 and 304 may be tri-statable. Based upon the control signal, the first and second inverters 302 and 304 can enter a high-impedance (or, high-Z) state where their output appears as a high impedance. This effectively disconnects the first and second inverters 302 and 304 from the rest of the circuit. Once the control signal instructs the first and second inverters 302 and 304 to leave their high-Z state, the first inverter 302 inverts the signal on the word line and passes the signal to the second inverter 304. The second inverter 304 then inverts the signal again and drives the word line to the desired high or low condition.

Referring now to FIG. 6A, a functional schematic diagram of another exemplary regeneration latch 320 is depicted. The regeneration latch 320 includes first and second inverters 322 and 324, each having an input and an output. The first and second inverters 322 and 324 are powered by supply potentials, such as $V_{DD}$ and $V_{SS}$. The second inverter 324 may be tri-statable based upon a control signal. Because the output of the first inverter 322 is not fed to the word line, the output of the first inverter 322 may not need to be placed in a high-Z state. This allows the first inverter 322 to be implemented using fewer transistors.

Referring now to FIG. 6B, a functional schematic diagram of an exemplary implementation of the regeneration latch 320 of FIG. 6A is depicted. The regeneration latch 320 includes first and second transistors 342 and 344, which form the first inverter 322. The regeneration latch 320 also includes third, fourth, fifth, and sixth transistors 346, 348, 350, and 352, which form the second inverter 324.

The control signal is used to turn off the fifth and sixth transistors 350 and 352, thereby disabling the output of the second inverter 324. The fifth and sixth transistors 350 and 352 are disabled by opposite control signals. To create these signals, seventh and eighth transistors 354 and 356 invert the control signal.

The transistors 342, 344, 346, 348, 350, 352, 354, and 356 may be metal-oxide-semiconductor field-effect transistors (MOSFETs) that each has a gate, a drain, and a source. The transistors 342, 346, 350, and 354 may be p-channel MOSFETs, while the transistors 344, 348, 352, and 356 may be n-channel MOSFETs.

The control signal is received at the gates of the transistors 350, 354, and 356. The sources of the transistors 342, 350, and 354 are connected to an upper reference potential, such as $V_{DD}$. The sources of the transistors 344, 352, and 356 are connected to a lower reference potential, such as $V_{SS}$. The drains of the transistors 354 and 356 are connected to the gate of the transistor 352.

The gates of the transistors 342 and 344 are connected to the drains of the transistors 346 and 348, which are connected to the word line. The drains of the transistors 342 and 344 are connected to the gates of the transistors 346 and 348. The source of the transistor 346 is connected to the drain of the transistor 350, while the source of the transistor 348 is connected to the drain of the transistor 352.

Referring now to FIG. 6C, a functional schematic diagram of an exemplary implementation of the regeneration latch 300 of FIG. 6 is depicted. The regeneration latch 300 is similar to the regeneration latch 320 of FIG. 6B. However, the first inverter 302, which includes the transistors 342 and 344, is tri-statable, as shown in FIG. 6. To achieve this capability, a transistor 402 is inserted between the transistor 342 and the upper supply potential. In addition, a transistor 404 is inserted between the transistor 344 and the lower supply potential.

The transistor 402 receives the uninverted control signal, while the transistor 404 receives the inverted control signal. In this way, the first and second inverters 302 and 304 can both be placed in a high-Z state by the control signal. In various implementations, the control signal may be defined as active high, where a high control signal will enable operation of the inverters. In such a case, the connections of the control signal and the inverted control signal to the gates of the transistors 402 and 404 and 350 and 352 can be swapped.

Referring now to FIG. 6D, a functional schematic diagram of another exemplary implementation of the regeneration latch 300 of FIG. 6, where dual control signals are received is depicted. If both the control signal and an inverted control signal, denoted $\overline{Control}$, are available to the regeneration latch 300, the inverter shown in FIG. 6C formed by the transistors 354 and 356 can be omitted. The regeneration latch 320 of FIG. 6B can be similarly modified when $\overline{Control}$ is available.

Referring now to FIG. 7, a functional schematic diagram of an exemplary regeneration latch 500 is presented. The regeneration latch 500 includes a switching element 502 and an inverter 504. The switching element 502 may be an n-channel MOSFET having a gate, a drain, and a source. The gate of the switching element 502 is connected to an output of the inverter 504. The drain of the switching element 502 is connected to an input of the inverter 504 and also to the word line. The source of the switching element 502 is connected to a control signal.

The inverter 504 is powered by supply potentials, such as $V_{DD}$ and $V_{SS}$. When the word line is high, the inverter 504 pulls the gate of the switching element 502 low, thereby turning it off. When the word line is approaching a low voltage, an inverter 504 pulls the gate of the switching element 502 high. If the source of the switching element 502 is pulled low while the gate is being pulled high, the switching element 502 will conduct current from the word line to the control line, thereby driving the word line low.

Referring now to FIG. 7A, a functional schematic diagram of an exemplary regeneration latch 540 capable of pulling the word line high is depicted. The regeneration latch 540 includes a switching element 542 and an inverter 544. The switching element 542 may be a p-channel MOSFET whose gate is connected to an output of the inverter 544. When the word line, which is connected to the drain of the switching element 542, is high, the inverter 544 pulls the gate of the switching element 542 low. If the control signal is high, the source-gate voltage $V_{SG}$ that is created turns the switching element 542 on and pulls the word line high.

Referring now to FIG. 7B, a functional schematic diagram of an exemplary implementation of the regeneration latch 500 of FIG. 7 is depicted. The regeneration latch 540 of FIG. 7A can be implemented similarly. The inverter 504 of FIG. 7 is implemented as first and second transistors 582 and 584. The transistors 582 and 584 may be a p-channel MOSFET and an n-channel MOSFET, respectively, which each have a gate, a source, and a drain.

The drains of the transistors 582 and 584 are connected to the gate of the transistor 502. The gates of the transistors 582 and 584 are connected to the drain of the transistor 502, which is connected to the word line. The source of the transistor 582 is connected to an upper supply potential, such as $V_{DD}$, while the source of the transistor 584 is connected to a lower supply potential, such as $V_{SS}$.

Referring now to FIG. 7C, another exemplary implementation of the regeneration latch 500 is depicted. At least one terminal of the transistor 584, such as the source, and at least one terminal of the switching element 502, such as the source, are connected to the control line (Control). In this implementation, a secondary supply potential (e.g., $V_{SS}$) is not required. In one implementation, additional circuitry elements and/or control elements (not shown) can be introduced to the regeneration latch 500 shown in FIG. 7C to alter and/or enhance operation of the regeneration latch 500, e.g., when only a single supply potential is provided to the regeneration latch 500.

Referring now to FIG. 8, a functional schematic diagram of an exemplary phase change memory array incorporating the regeneration latch 500 of FIG. 7 is depicted. Phase change memory cells 240 are located at the intersections of the bit lines 108 and the word lines 104. Each of the word lines 104 includes at least one regeneration latch 500.

The control signal for the regeneration latches 500 is provided by the regeneration control module 284. The regeneration control module 284 may receive a signal from the row decoder 102 indicating when new values are being asserted on the word lines 104. If multiple regeneration latches 500 are provided per word line 104, the same control signal from the regeneration control module 284 may be used for each of the regeneration latches 500. Alternatively, delayed versions of the control signal may be used for regeneration latches 500 that are farther from the row decoder 102.

For simplicity, power lines for the inverters 504 of the regeneration latches 500 are not shown in FIG. 8. The actual power lines for the inverters 504 of the regeneration latches 500 can be relatively thin because little power is required to switch the inverter 504 and drive the gate of the transistor 502. The control signal from the regeneration control module 284 may be more substantial because it carries the base currents of the memory cells 240 of the associated word line 104.

Referring now to FIG. 9, graphical traces of exemplary control signals for sample word line data are depicted. Time is shown on the x-axis, and four time markers, $t_1$, $t_2$, $t_3$, and $t_4$, are included. A graphical trace 602 of a first word line shows the word line transitioning from high to low at time $t_3$ and from low to high at time $t_4$. A graphical trace 604 of a second word line shows the word line transitioning from high to low at time $t_1$ and from low to high at time $t_2$.

Graphical traces are shown for three control signal options: regeneration control A 606, regeneration control B 608, and regeneration control C 610. For purposes of illustration only, the graphical traces of control signals are shown as active-low signals. In other words, a low regeneration control signal turns on the regeneration control module, and a low word line signal activates the corresponding word line of memory cells.

Control A 606 is shown transitioning from high to low a predetermined period after time $t_1$ and transitioning from low to high at time $t_2$. Control A 606 also transitions from high to low a predetermined period after time $t_3$ and transitions from low to high at time $t_4$. The period between time to and the transition of control A 606 from high to low allows the new low value of the second word line to propagate down the word line. This delay period prevents the regeneration latch from latching the previous word line value before the new word line value arrives. At time $t_2$, control A 606 returns to a high value, thereby disabling the regeneration latch and allowing the second word line 604 to return to a high level.

Control B 608 is shown transitioning from low to high a predetermined period before time $t_2$. This allows control B 608 to propagate to the regeneration latches and fully disable them before the word line attempts to change values. Control C 610 may be used when the regeneration latch can pull the word line both high and low. Control C 610 transitions from low to high at each time $t_1$ through $t_4$, and then transitions from high to low a specified period after the times $t_1$ through $t_4$.

The time in which control C 610 is high allows the word lines to change to new values. Control C 610 then instructs the regeneration latches to latch and fully drive the word lines to the new values. Because such latches can drive the word lines high, control C 610 is shown transitioning low even when both word lines 602 and 604 are at high (inactive) values. This may improve speed of the memory.

Figure 10A:
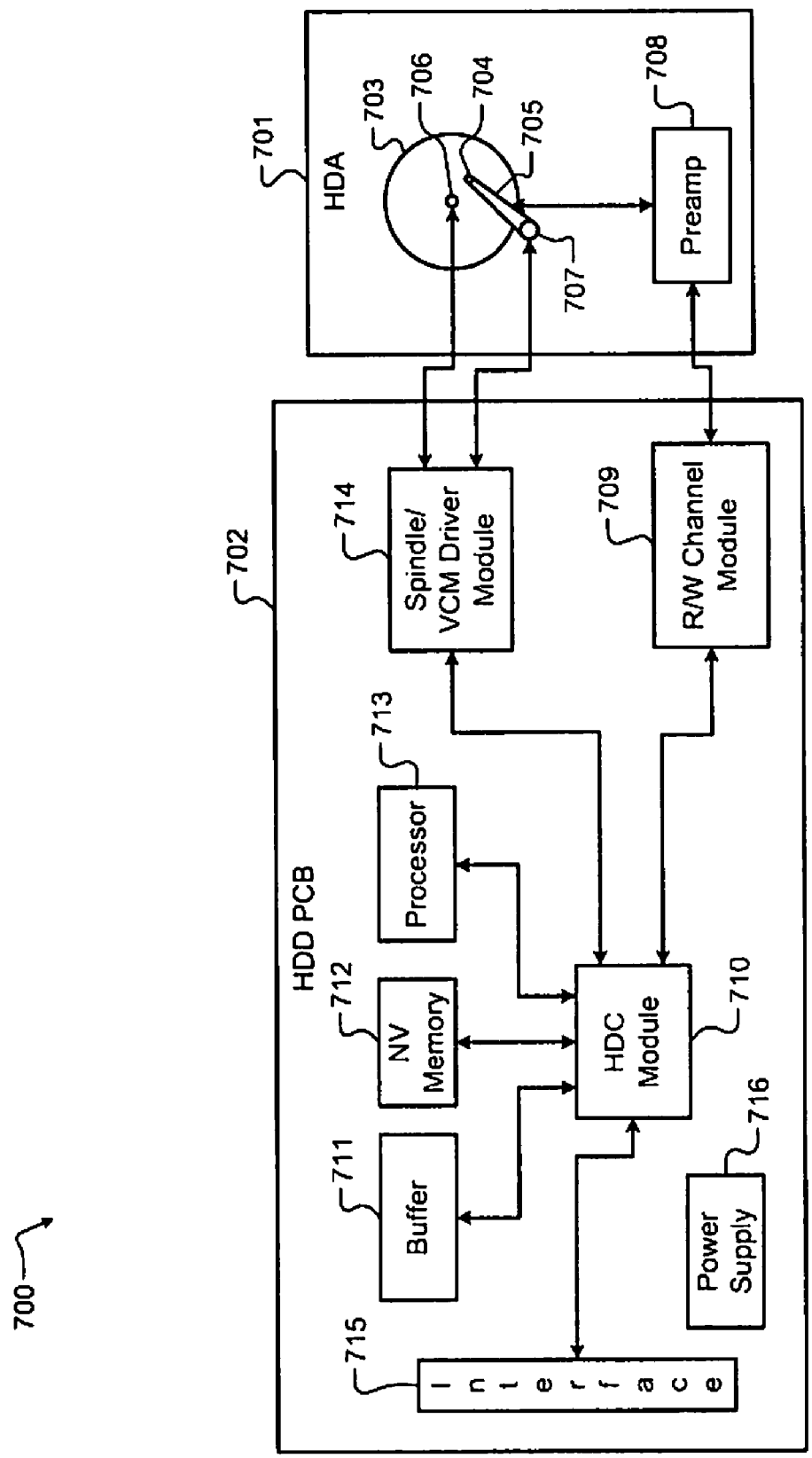
FIG. 10A is a functional block diagram of a hard disk drive.

Referring now to FIGS. 10A-10G, various exemplary implementations incorporating the teachings of the present disclosure are shown. Referring now to FIG. 10A, the teachings of the disclosure can be implemented in a buffer 711 or nonvolatile memory 712 of a hard disk drive (HDD) 700. The HDD 700 includes a hard disk assembly (HDA) 701 and an HDD printed circuit board (PCB) 702. The HDA 701 may include a magnetic medium 703, such as one or more platters that store data, and a read/write device 704.

The read/write device 704 may be arranged on an actuator arm 705 and may read and write data on the magnetic medium 703. Additionally, the HDA 701 includes a spindle motor 706 that rotates the magnetic medium 703 and a voice-coil motor (VCM) 707 that actuates the actuator arm 705. A preamplifier device 708 amplifies signals generated by the read/write device 704 during read operations and provides signals to the read/write device 704 during write operations.

The HDD PCB 702 includes a read/write channel module (hereinafter, "read channel") 709, a hard disk controller (HDC) module 710, the buffer 711, nonvolatile memory 712, a processor 713, and a spindle/VCM driver module 714. The read channel 709 processes data received from and transmitted to the preamplifier device 708. The HDC module 710 controls components of the HDA 701 and communicates with an external device (not shown) via an I/O interface 715. The external device may include a computer, a multimedia device, a mobile computing device, etc. The I/O interface 715 may include wireline and/or wireless communication links.

The HDC module 710 may receive data from the HDA 701, the read channel 709, the buffer 711, nonvolatile memory 712, the processor 713, the spindle/VCM driver module 714, and/or the I/O interface 715. The processor 713 may process the data, including encoding, decoding, filtering, and/or formatting. The processed data may be output to the HDA 701, the read channel 709, the buffer 711, nonvolatile memory 712, the processor 713, the spindle/VCM driver module 714, and/or the I/O interface 715.

The HDC module 710 may use the buffer 711 and/or nonvolatile memory 712 to store data related to the control and operation of the HDD 700. The buffer 711 may include DRAM, SDRAM, etc. Nonvolatile memory 712 may include any suitable type of semiconductor or solid-state memory, such as flash memory (including NAND and NOR flash memory), phase change memory, magnetic RAM, and multi-state memory, in which each memory cell has more than two states. The spindle/VCM driver module 714 controls the spindle motor 706 and the VCM 707. The HDD PCB 702 includes a power supply 716 that provides power to the components of the HDD 700.

Figure 10B:
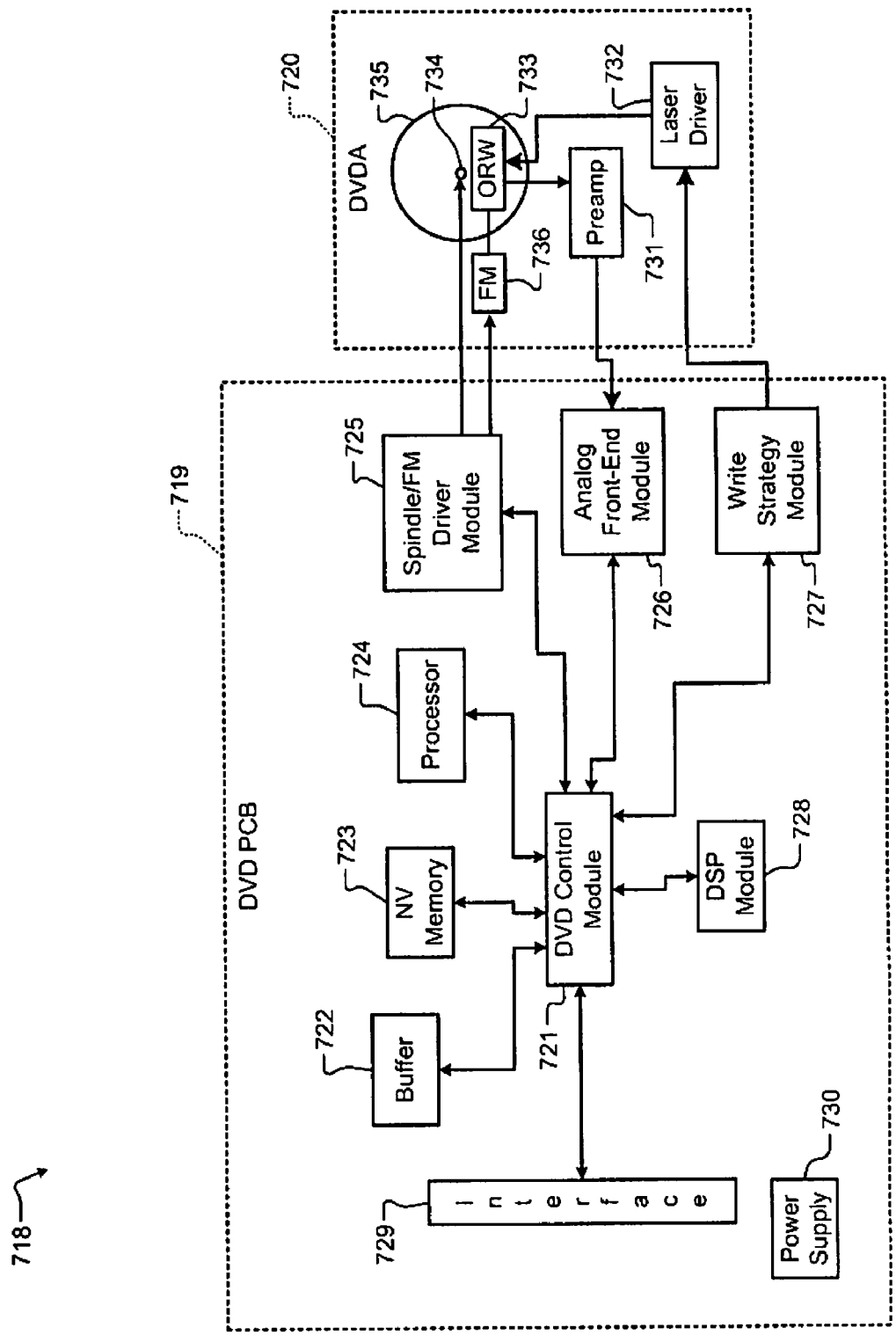
FIG. 10B is a functional block diagram of a DVD drive.

Referring now to FIG. 10B, the teachings of the disclosure can be implemented in a buffer 722 or nonvolatile memory 723 of a DVD drive 718 or of a CD drive (not shown). The DVD drive 718 includes a DVD PCB 719 and a DVD assembly (DVDA) 720. The DVD PCB 719 includes a DVD control module 721, the buffer 722, nonvolatile memory 723, a processor 724, a spindle/FM (feed motor) driver module 725, an analog front-end module 726, a write strategy module 727, and a DSP module 728.

The DVD control module 721 controls components of the DVDA 720 and communicates with an external device (not shown) via an I/O interface 729. The external device may include a computer, a multimedia device, a mobile computing device, etc. The I/O interface 729 may include wireline and/or wireless communication links.

The DVD control module 721 may receive data from the buffer 722, nonvolatile memory 723, the processor 724, the spindle/FM driver module 725, the analog front-end module 726, the write strategy module 727, the DSP module 728, and/or the I/O interface 729. The processor 724 may process the data, including encoding, decoding, filtering, and/or formatting. The DSP module 728 performs signal processing, such as video and/or audio coding/decoding. The processed data may be output to the buffer 722, nonvolatile memory 723, the processor 724, the spindle/FM driver module 725, the analog front-end module 726, the write strategy module 727, the DSP module 728, and/or the I/O interface 729.

The DVD control module 721 may use the buffer 722 and/or nonvolatile memory 723 to store data related to the control and operation of the DVD drive 718. The buffer 722 may include DRAM, SDRAM, etc. Nonvolatile memory 723 may include any suitable type of semiconductor or solid-state memory, such as flash memory (including NAND and NOR flash memory), phase change memory, magnetic RAM, and multi-state memory, in which each memory cell has more than two states. The DVD PCB 719 includes a power supply 730 that provides power to the components of the DVD drive 718.

The DVDA 720 may include a preamplifier device 731, a laser driver 732, and an optical device 733, which may be an optical read/write (ORW) device or an optical read-only (OR) device. A spindle motor 734 rotates an optical storage medium 735, and a feed motor 736 actuates the optical device 733 relative to the optical storage medium 735.

When reading data from the optical storage medium 735, the laser driver provides a read power to the optical device 733. The optical device 733 detects data from the optical storage medium 735, and transmits the data to the preamplifier device 731. The analog front-end module 726 receives data from the preamplifier device 731 and performs such functions as filtering and A/D conversion. To write to the optical storage medium 735, the write strategy module 727 transmits power level and timing data to the laser driver 732. The laser driver 732 controls the optical device 733 to write data to the optical storage medium 735.

Figure 10D:
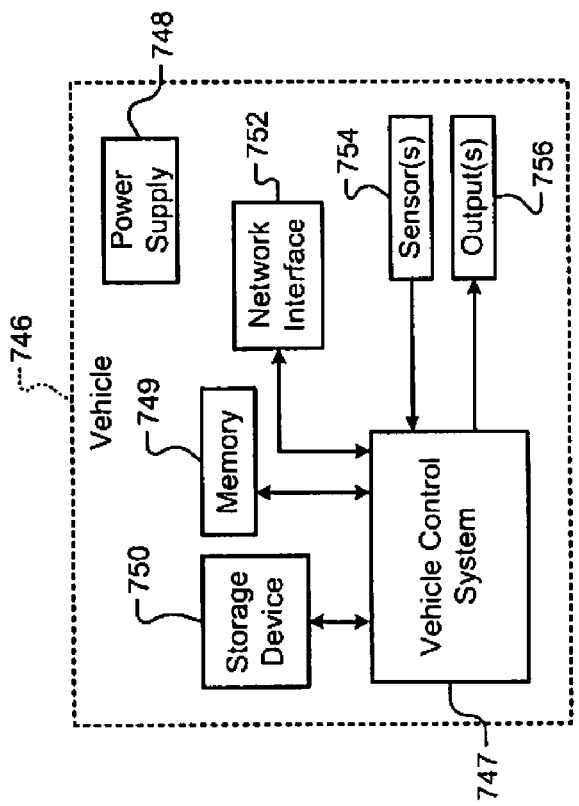
FIG. 10D is a functional block diagram of a vehicle control system.
Figure 10C:
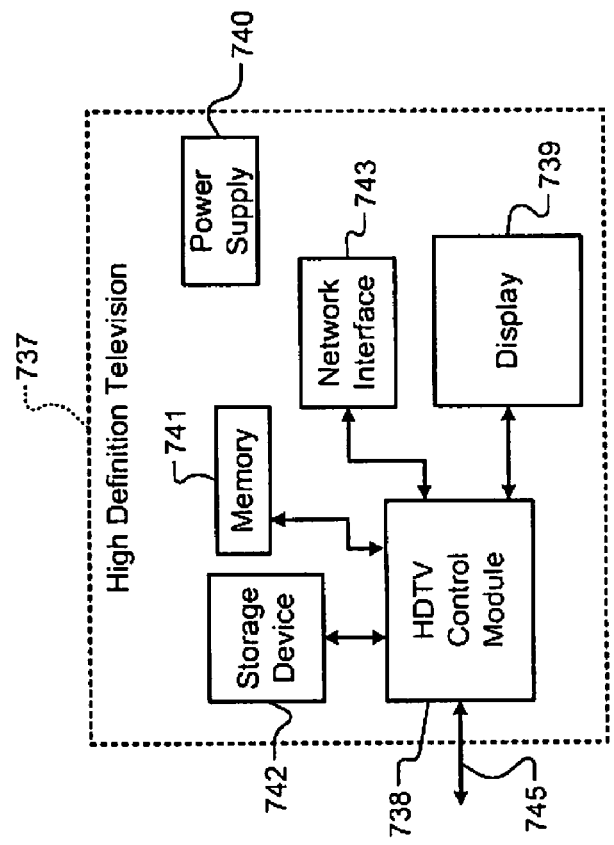
FIG. 10C is a functional block diagram of a high definition television.

Referring now to FIG. 10C, the teachings of the disclosure can be implemented in memory 741 of a high definition television (HDTV) 737. The HDTV 737 includes an HDTV control module 738, a display 739, a power supply 740, memory 741, a storage device 742, a network interface 743, and an external interface 745. If the network interface 743 includes a wireless local area network interface, an antenna (not shown) may be included.

The HDTV 737 can receive input signals from the network interface 743 and/or the external interface 745, which can send and receive data via cable, broadband Internet, and/or satellite. The HDTV control module 738 may process the input signals, including encoding, decoding, filtering, and/or formatting, and generate output signals. The output signals may be communicated to one or more of the display 739, memory 741, the storage device 742, the network interface 743, and the external interface 745.

Memory 741 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 742 may include an optical storage drive, such as a DVD drive, and/or a hard disk drive (HDD). The HDTV control module 738 communicates externally via the network interface 743 and/or the external interface 745. The power supply 740 provides power to the components of the HDTV 737.

Referring now to FIG. 10D, the teachings of the disclosure may be implemented in memory 749 of a vehicle 746. The vehicle 746 may include a vehicle control system 747, a power supply 748, memory 749, a storage device 750, and a network interface 752. If the network interface 752 includes a wireless local area network interface, an antenna (not shown) may be included. The vehicle control system 747 may be a powertrain control system, a body control system, an entertainment control system, an anti-lock braking system (ABS), a navigation system, a telematics system, a lane departure system, an adaptive cruise control system, etc.

The vehicle control system 747 may communicate with one or more sensors 754 and generate one or more output signals 756. The sensors 754 may include temperature sensors, acceleration sensors, pressure sensors, rotational sensors, airflow sensors, etc. The output signals 756 may control engine operating parameters, transmission operating parameters, suspension parameters, etc.

The power supply 748 provides power to the components of the vehicle 746. The vehicle control system 747 may store data in memory 749 and/or the storage device 750. Memory 749 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 750 may include an optical storage drive, such as a DVD drive, and/or a hard disk drive (HDD). The vehicle control system 747 may communicate externally using the network interface 752.

Figure 10F:
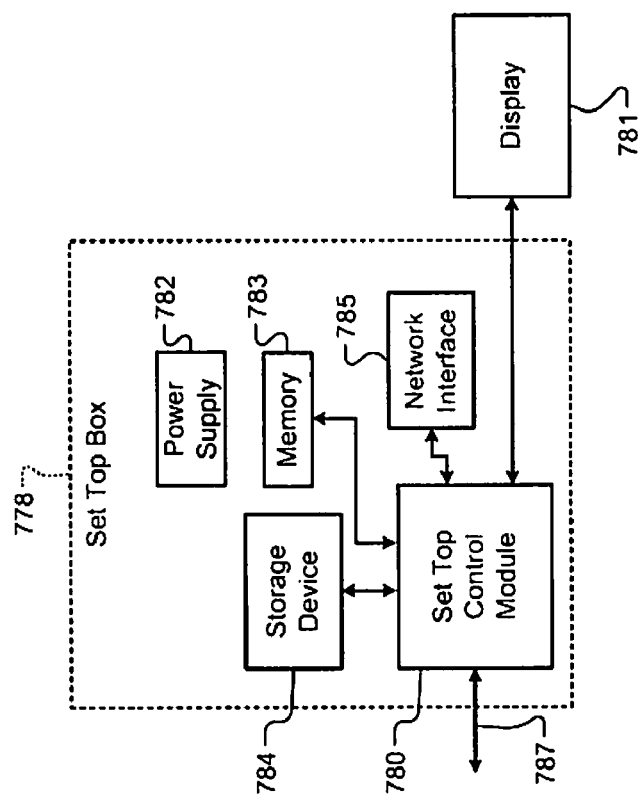
FIG. 10F is a functional block diagram of a set top box.
Figure 10E:
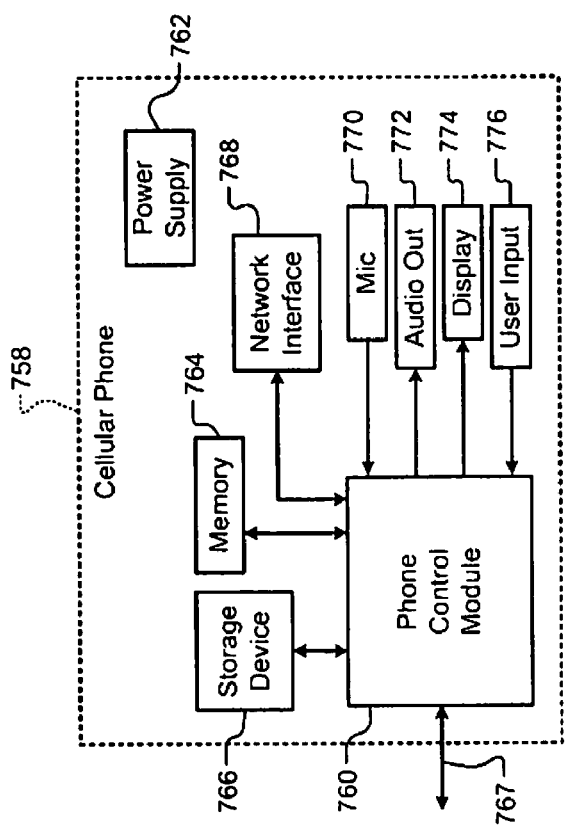
FIG. 10E is a functional block diagram of a cellular phone.

Referring now to FIG. 10E, the teachings of the disclosure can be implemented in memory 764 of a cellular phone 758. The cellular phone 758 includes a phone control module 760, a power supply 762, memory 764, a storage device 766, and a cellular network interface 767. The cellular phone 758 may include a network interface 768, a microphone 770, an audio output 772 such as a speaker and/or output jack, a display 774, and a user input device 776 such as a keypad and/or pointing device. If the network interface 768 includes a wireless local area network interface, an antenna (not shown) may be included.

The phone control module 760 may receive input signals from the cellular network interface 767, the network interface 768, the microphone 770, and/or the user input device 776. The phone control module 760 may process signals, including encoding, decoding, filtering, and/or formatting, and generate output signals. The output signals may be communicated to one or more of memory 764, the storage device 766, the cellular network interface 767, the network interface 768, and the audio output 772.

Memory 764 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 766 may include an optical storage drive, such as a DVD drive, and/or a hard disk drive (HDD). The power supply 762 provides power to the components of the cellular phone 758.

Referring now to FIG. 10F, the teachings of the disclosure can be implemented in memory 783 of a set top box 778. The set top box 778 includes a set top control module 780, a display 781, a power supply 782, memory 783, a storage device 784, and a network interface 785. If the network interface 785 includes a wireless local area network interface, an antenna (not shown) may be included.

The set top control module 780 may receive input signals from the network interface 785 and an external interface 787, which can send and receive data via cable, broadband Internet, and/or satellite. The set top control module 780 may process signals, including encoding, decoding, filtering, and/or formatting, and generate output signals. The output signals may include audio and/or video signals in standard and/or high definition formats. The output signals may be communicated to the network interface 785 and/or to the display 781. The display 781 may include a television, a projector, and/or a monitor.

The power supply 782 provides power to the components of the set top box 778. Memory 783 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 784 may include an optical storage drive, such as a DVD drive, and/or a hard disk drive (HDD).

Figure 10G:
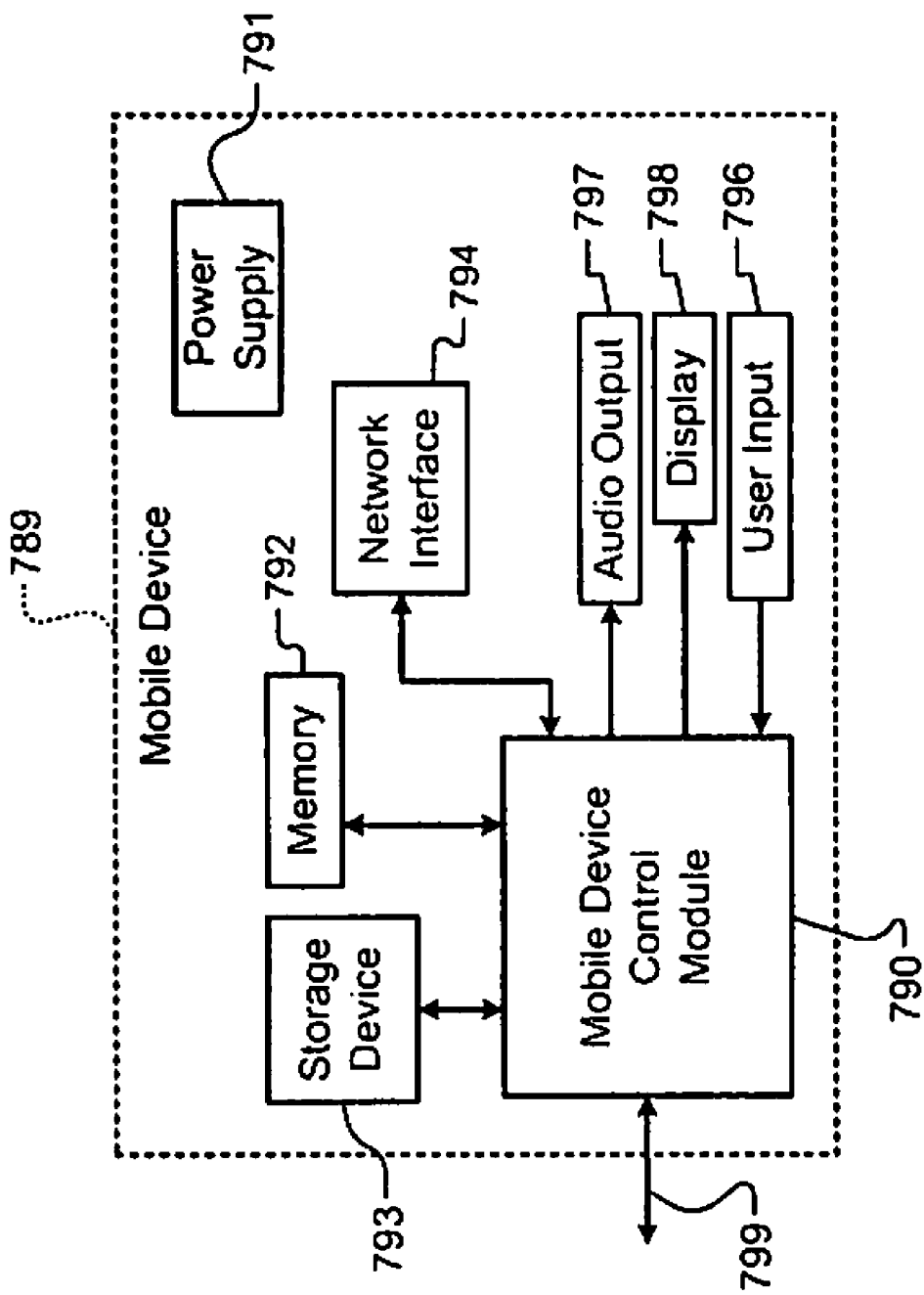
FIG. 10G is a functional block diagram of a mobile device.

Referring now to FIG. 10G, the teachings of the disclosure can be implemented in memory 792 of a mobile device 789. The mobile device 789 may include a mobile device control module 790, a power supply 791, memory 792, a storage device 793, a network interface 794, and an external interface 799. If the network interface 794 includes a wireless local area network interface, an antenna (not shown) may be included.

The mobile device control module 790 may receive input signals from the network interface 794 and/or the external interface 799. The external interface 799 may include USB, infrared, and/or Ethernet. The input signals may include compressed audio and/or video, and may be compliant with the MP3 format. Additionally, the mobile device control module 790 may receive input from a user input 796 such as a keypad, touchpad, or individual buttons. The mobile device control module 790 may process input signals, including encoding, decoding, filtering, and/or formatting, and generate output signals.

The mobile device control module 790 may output audio signals to an audio output 797 and video signals to a display 798. The audio output 797 may include a speaker and/or an output jack. The display 798 may present a graphical user interface, which may include menus, icons, etc. The power supply 791 provides power to the components of the mobile device 789. Memory 792 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 793 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory comprising:
a plurality of memory cells that selectively draw DC current;
a row decoder module that selectively drives word lines using a voltage level to access selected ones of the memory cells; and
a first regeneration module that
receives a control signal having an active state and an inactive state, and
selectively pulls the voltage level on one of the word lines to one of first and second predetermined voltage levels when the control signal has the active state,
wherein at least one of the memory cells of the one of the word lines is located between the first regeneration module and the row decoder module, and
wherein the control signal has the active state during periods of time that the voltage level on the one of the word lines is not transitioning.

2. The memory of claim 1, wherein the first predetermined voltage level is greater than the second predetermined voltage level, and wherein the first regeneration module selectively pulls the voltage level to the first predetermined voltage level when the voltage level is greater than a predetermined threshold.

3. The memory of claim 2, wherein the first regeneration module selectively pulls the voltage level to the second predetermined voltage level when the voltage level is less than the predetermined threshold.

4. The memory of claim 2, wherein the first regeneration module suspends pulling the voltage level to the first predetermined voltage level when the voltage level is less than the predetermined threshold.

5. The memory of claim 1, wherein the first predetermined voltage level is greater than the second predetermined voltage level, and wherein the first regeneration module selectively pulls the voltage level to the second predetermined voltage level when the voltage level is less than a predetermined threshold.

6. The memory of claim 5, wherein the first regeneration module suspends pulling the voltage level to the second predetermined voltage level when the voltage level is greater than the predetermined threshold.

7. The memory of claim 1, wherein the one of the word lines extends between the row decoder module and a distal cell of the memory cells, and wherein the first regeneration module is located adjacent to the distal cell.

8. The memory of claim 7, further comprising a second regeneration module for the one of the word lines that is located between the distal cell and the row decoder module.

9. The memory of claim 1, wherein the one of the word lines extends between the row decoder module and a distal cell of the memory cells, and wherein the first regeneration module is located halfway between the distal cell and the row decoder module.

10. The memory of claim 1, wherein the word lines comprise N word lines, wherein N is an integer greater than 1, and wherein the memory further comprises N regeneration modules including the first regeneration module, wherein each of the N regeneration modules corresponds to a respective one of the N word lines.

11. The memory of claim 1, wherein the memory cells include bipolar junction transistors.

12. The memory of claim 1, wherein the memory cells include phase-change memory devices.

13. The memory of claim 1, further comprising a regeneration control module that generates the control signal having the inactive state for a predetermined period of time after the row decoder module drives the voltage level onto the word lines.

14. The memory of claim 13, wherein the regeneration control module generates the control signal having the inactive state for a second predetermined period of time before the row decoder module drives the voltage level onto the word lines.

15. The memory of claim 1, wherein the first regeneration module includes first and second inverters each having an input and an output, wherein the output of the first inverter communicates with the input of the second inverter, and wherein the output of the second inverter and the input of the first inverter communicate with the one of the word lines.

16. The memory of claim 15, wherein the second inverter is selectively placed in a high-impedance state by the control signal.

17. The memory of claim 16, wherein the second inverter is placed in the high-impedance state by the control signal.

18. The memory of claim 1, wherein the first regeneration module includes (i) an inverter having an input and an output and (ii) a transistor having a control terminal, a first terminal, and a second terminal.

19. A method for operating memory, the method comprising:
providing a plurality of memory cells that selectively draw DC current;
using a row decoder module to selectively drive word lines using a voltage level to access selected ones of the memory cells;
generating a control signal having an active state and an inactive state;
providing a first regeneration module that selectively pulls the voltage level on one of the word lines to one of first and second predetermined voltage levels when the control signal has the active state, wherein the control signal has the active state during periods of time that the voltage level on the one of the word lines is not transitioning; and
locating at least one of the memory cells of the one of the word lines between the first regeneration module and the row decoder module.

20. The method of claim 19, wherein the first predetermined voltage level is greater than the second predetermined voltage level, and wherein the method further comprises selectively pulling the voltage level to the first predetermined voltage level when the voltage level is greater than a predetermined threshold.

21. The method of claim 20, further comprising selectively pulling the voltage level to the second predetermined voltage level when the voltage level is less than the predetermined threshold.

22. The method of claim 20, further comprising suspending pulling the voltage level to the first predetermined voltage level when the voltage level is less than the predetermined threshold.

23. The method of claim 19, wherein the first predetermined voltage level is greater than the second predetermined voltage level, and wherein the method further comprises selectively pulling the voltage level to the second predetermined voltage level when the voltage level is less than a predetermined threshold.

24. The method of claim 23, further comprising suspending pulling the voltage level to the second predetermined voltage level when the voltage level is greater than the predetermined threshold.

25. The method of claim 19, wherein the one of the word lines extends between the row decoder module and a distal cell of the memory cells, and wherein the first regeneration module is located adjacent to the distal cell.

26. The method of claim 25, further comprising providing a second regeneration module for the one of the word lines that is located between the distal cell and the row decoder module.

27. The method of claim 19, further comprising:
extending the one of the word lines between the row decoder module and a distal cell of the memory cells; and
locating the first regeneration module is located halfway between the distal cell and the row decoder module.

28. The method of claim 19, wherein the word lines comprise N word lines, wherein N is an integer greater than 1, and wherein the method further comprises providing N regeneration modules including the first regeneration module, wherein each of the N regeneration modules corresponds to a respective one of the N word lines.

29. The method of claim 19, wherein the memory cells include bipolar junction transistors.

30. The method of claim 19, wherein the memory cells include phase-change memory devices.

31. The method of claim 19, further comprising generating the control signal having the inactive state for a predetermined period of time after the row decoder module drives the voltage level onto the word lines.

32. The method of claim 31, further comprising generating the control signal having the inactive state for a second predetermined period of time before the row decoder module drives the voltage level onto the word lines.

33. A memory comprising:
a plurality of word lines each including a plurality of memory cells, each memory cell selectively drawing DC current;
a row decoder module that supplies a voltage level to a driven one of the plurality of word lines to access selected ones of the memory cells associated with the driven one of the plurality of word lines; and
a plurality of regeneration modules each configured to selectively pull the voltage level to one of a first predetermined voltage level and a second predetermined voltage level when a control signal has an active state, wherein the control signal has one of an inactive state and the active state,
wherein one or more of the plurality of regeneration modules are disposed along each of the plurality of word lines and are arranged between two of the plurality of memory cells in each of the plurality of word lines, and
wherein the control signal has the active state during periods of time that the voltage level on the driven one of the plurality of word lines is not transitioning.

34. The memory of claim 33, wherein the first predetermined voltage level is greater than the second predetermined voltage level, and wherein each of the plurality of regeneration modules is further configured to selectively pull the voltage level to the first predetermined voltage level when the voltage level is greater than a predetermined threshold.

35. The memory of claim 34, wherein of the plurality of regeneration modules is further configured to selectively pull the voltage level to the second predetermined voltage level when the voltage level is less than the predetermined threshold.

36. The memory of claim 33, further comprising a plurality of control modules each configured to generate the control signal for a group of the plurality of regeneration modules associated with the plurality of word lines, wherein the group of regeneration modules includes at least one of the plurality of regeneration modules from each of the plurality of word lines.

37. The memory of claim 33, wherein the control signal for each of the plurality of regeneration modules has the inactive state until after a predetermined period.

38. The memory of claim 37, wherein the predetermined period starts after the voltage level is applied by the row decoder module.

39. The memory of claim 33, wherein the plurality of memory cells include bipolar junction transistors.

40. The memory of claim 39, wherein the plurality of memory cells further include phase-change memory devices.

41. The memory of claim 33, wherein at least one of the plurality of regeneration modules includes first and second inverters each having an input and an output, wherein the output of the first inverter communicates with the input of the second inverter, and wherein the output of the second inverter and the input of the first inverter communicate with one of the plurality of word lines.

42. The memory of claim 41, wherein the second inverter is selectively placed in a high-impedance state by the control signal.

43. The memory of claim 42, wherein the second inverter is selectively placed in the high-impedance state by the control signal.

44. The memory of claim 33, wherein at least one of the plurality of regeneration modules includes (i) an inverter having an input and an output and (ii) a transistor having a control terminal, a first terminal, and a second terminal.

45. The memory of claim 44, wherein the output of said the inverter communicates with (i) the control terminal of the transistor and (ii) the first terminal of the transistor, wherein the input of the inverter communicates with one of the plurality of word lines, and wherein the second terminal of the transistor receives the control signal.

* * * * *